United States Patent
Mayega et al.

(10) Patent No.: US 9,941,795 B1
(45) Date of Patent: Apr. 10, 2018

(54) CIRCUITS AND METHOD FOR EXTRACTING AVERAGE LOAD CURRENT IN DC-DC SWITCHING CONVERTERS

(71) Applicant: Dialog Semiconductor (UK) Limited, London (GB)

(72) Inventors: John Mayega, Herent (BE); Kemal Ozanoglu, Istanbul (TR); Mark Childs, Swindon (GB); Turan Solmaz, Istanbul (TR)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/491,320

(22) Filed: Apr. 19, 2017

(51) Int. Cl.
*H02M 3/158* (2006.01)
*H02M 1/08* (2006.01)
(Continued)

(52) U.S. Cl.
CPC .......... *H02M 3/158* (2013.01); *G01R 19/003* (2013.01); *G01R 19/04* (2013.01); *H02M 1/08* (2013.01);
(Continued)

(58) Field of Classification Search
CPC .... H02M 3/158; H02M 3/1584; H02M 3/156; H02M 3/155; G05F 1/40; G05F 1/44; G05F 1/56; G05F 1/59
(Continued)

(56) References Cited

U.S. PATENT DOCUMENTS

| 5,198,746 A | * | 3/1993 | Gyugyi | H02J 3/1814 |
| | | | | 307/102 |
| 8,536,842 B2 | | 9/2013 | Prodlc et al. | |

(Continued)

FOREIGN PATENT DOCUMENTS

| DE | 11 2012 007 201 | 8/2015 |
| DE | 10 2015 112 809 | 2/2016 |

(Continued)

OTHER PUBLICATIONS

"Average Current Mode Control of Switching Power Supplies," by Lloyd Dixon, Unitrode Application Note, U-140, 3-356 to 3-369, Copyright 1999, Texas Instruments Incorporated.
(Continued)

*Primary Examiner* — Adolf Berhane
(74) *Attorney, Agent, or Firm* — Saile Ackerman LLC; Stephen B. Ackerman; Billy Knowles

(57) ABSTRACT

An average load current calculator circuit configured for determining an average load current within an at least one phase switch mode power converter (SMPC) having at least one peak/valley detector receives an inductor current sense signal and determines and holds a peak or valley amplitude of the inductor current sense signal. A current corrector circuit receives an input voltage and an output voltage of the SMPC and an inductance value of the inductor of the SMPC for determining an average correction current of the peak or valley amplitude of the current sense. An average current generator receives the peak or valley amplitude of the current sense signal and the average correction current for determining the instantaneous average load current within a switch mode power converter (SMPC) by additively combining the peak or valley amplitude of the current sense signal and the average correction current.

32 Claims, 12 Drawing Sheets

(51) Int. Cl.
*H02M 1/14* (2006.01)
*H02M 1/12* (2006.01)
*G01R 19/00* (2006.01)
*G01R 19/04* (2006.01)
*H02M 1/00* (2006.01)

(52) U.S. Cl.
CPC ............ *H02M 1/12* (2013.01); *H02M 1/143* (2013.01); *H02M 2001/0009* (2013.01); *H02M 2001/0025* (2013.01)

(58) Field of Classification Search
USPC .................. 323/265, 268–272, 282–285, 351
See application file for complete search history.

(56) References Cited

U.S. PATENT DOCUMENTS

| | | | |
|---|---|---|---|
| 8,587,275 B2 | 11/2013 | Nome Silva et al. | |
| 9,306,457 B2 | 4/2016 | Searles et al. | |
| 9,831,863 B2* | 11/2017 | Nene | H03K 5/1565 |
| 2009/0257258 A1* | 10/2009 | Ayukawa | H02M 1/42 363/89 |
| 2011/0062932 A1 | 3/2011 | Hawkes | |
| 2012/0212204 A1* | 8/2012 | Philbrick | H02M 3/156 323/284 |
| 2017/0110967 A1* | 4/2017 | Trichy | H02M 3/158 |

FOREIGN PATENT DOCUMENTS

| | | |
|---|---|---|
| DE | 10 2015 226 526 | 11/2016 |
| DE | 10 2016 117 492 | 3/2017 |

OTHER PUBLICATIONS

"Sensorless Current Mode Control—An Observer-Based Technique for DC-DC Converters," by Pallab Midya et al., IEEE Transactions on Power Electronics, vol. 16, No. 4, Jul. 2001, pp. 522-526.

"Current-Sensing Techniques for DC-DC Converters," by Hassan Pooya Forghani-Zadeh et al., The 2002 45th Midwest Symposium on Circuits and Systems, MWSCAS-2002, Aug. 4-7, 2002, II-577 to II-580.

"Modeling of Unbalanced Multiphase Buck Converters with Applications to Voltage Regulator Module Control," by J.T. Mossoba et al., Twentieth Annual IEEE Applied Power Electronics Conference and Exposition, APEC 2005, Mar. 6-10, 2005, pp. 1424-1429.

"An Accurate, Continuous, and Lossless Self-Learning CMOS Current-Sensing Scheme for Inductor-Based DC-DC Converters," by H. Pooya Forghani-Zadeh et al., IEEE Journal of Solid-State Circuits, vol. 42, No. 3, Mar. 2007, pp. 665-679.

"Robust Current Observer Design for DC-DC Converters," by Gionata Cimini et al., 3rd International Conference on Renewable Energy Research and Applications, Milwakuee, USA Oct. 19-22, 2014, pp. 958-963.

German Office Action, File No. 10 2017 212 837.2, Applicant: Dialog Semiconductor (UK) Limited, dated Dec. 12, 2017, 19 pgs and English language translation, 15 pgs.

\* cited by examiner

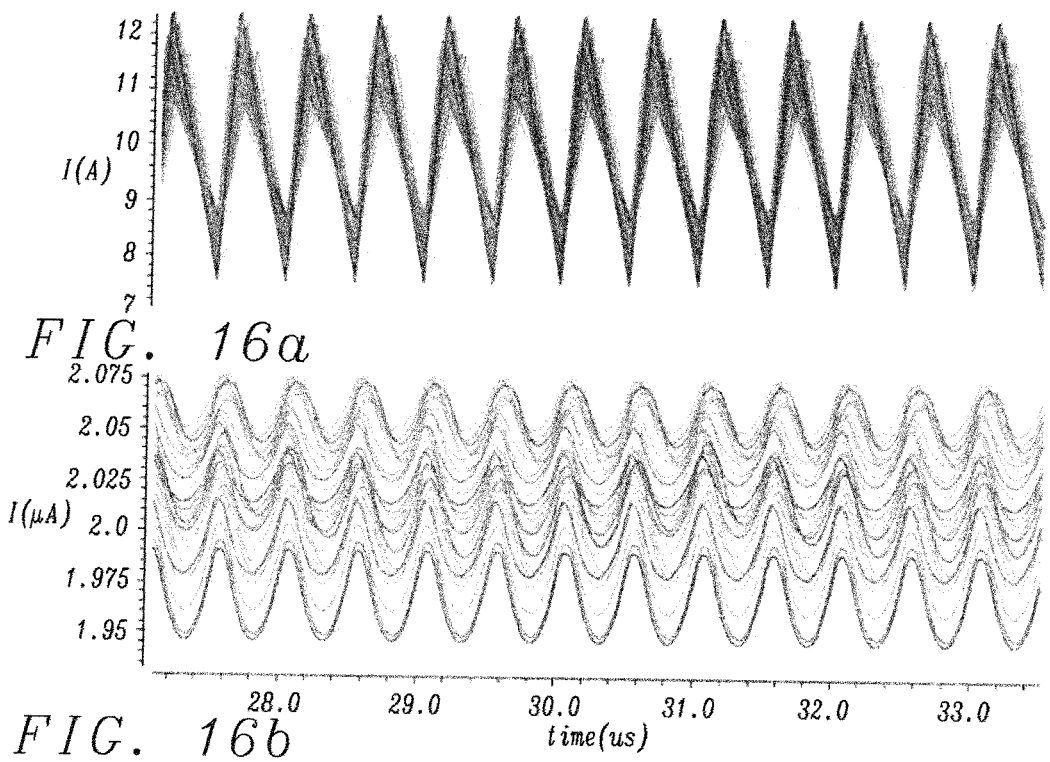
FIG. 16a
FIG. 16b
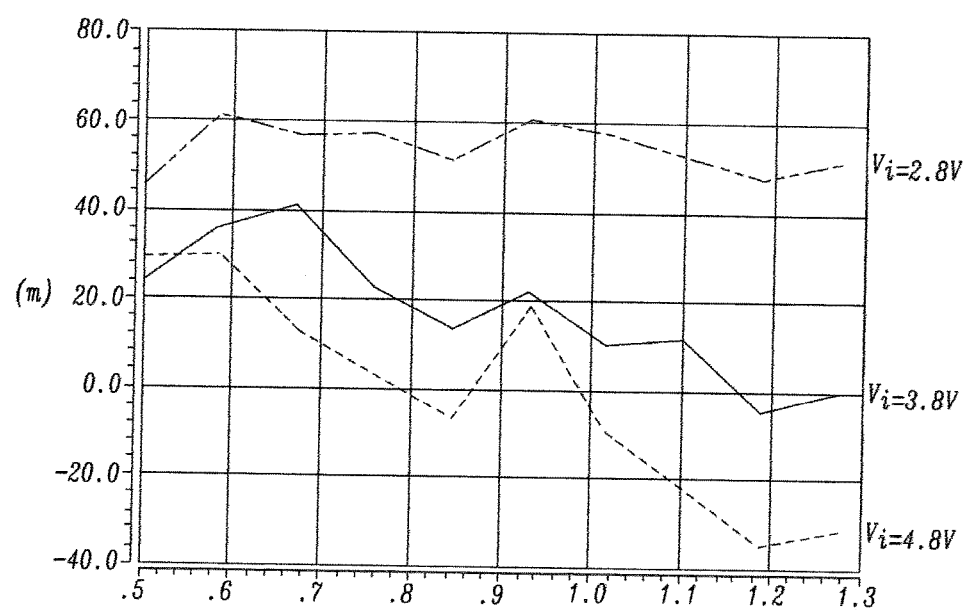
FIG. 17

US 9,941,795 B1

CIRCUITS AND METHOD FOR EXTRACTING AVERAGE LOAD CURRENT IN DC-DC SWITCHING CONVERTERS

TECHNICAL FIELD

This disclosure relates generally to a switch mode power converters (SMPC). More particularly, the present disclosure relates to extracting load current data from switch mode power converters. Even more particularly, this disclosure relates to circuits and methods for the sensorless extraction of instantaneous average load current data from switch mode power converters.

BACKGROUND

FIG. 1 is a schematic of a buck SMPC of the related art. The buck SMPC has a control stage 5, a switch stage 15, filter stage 20. An input voltage source 10 such as a battery has a first terminal connected to the input of the switch stage 15. A second terminal of the input voltage source 10 is connected the ground reference voltage source. The control stage 5 provides the necessary signals for activating and deactivating the switch stage 15 to control the current $I_L$ applied to the filter stage 20. The control stage 5 has an error amplifier (not shown) that receives a feedback voltage indicative of the output voltage $V_{OUT}$ from the output terminal 25 of the buck SMPC. A target reference voltage source (not shown) provides a target reference voltage to a second input of the error amplifier. The difference between the feedback voltage and the target reference voltage is used to generate an error signal (not shown) indicative of a difference between the output voltage $V_{OUT}$ of the SMPC and the target reference voltage $V_{REF}$. The target reference voltage is a design voltage level for the output voltage $V_{OUT}$ of the SMPC and thus the control stage 5 is structured to minimize the error signal.

The output of the error amplifier 20 is connected to the input of a pulse width modulation (PWM) generator (not shown). The PWM generator includes a PWM comparator (not shown) and a ramp generator (not shown). The PWM comparator receives the error signal at a noninverting input and a ramp clocking signal as created by the ramp generator at the inverting input. The PWM comparator compares the error signal and the ramp clocking signal and generates a digital PWM signal at the output of the PWM comparator. When the error signal applied to the noninverting input of the comparator is less than the ramp clocking signal applied to the inverting input, the digital PWM signal will be logical (0). As soon as the ramp clocking signal becomes larger than the error signal the digital PWM signal will be logical (1). The ramp clocking signal generates the digital PWM signal that has a pulse width proportional to $V_{OUT}$ at equilibrium condition and is based the error signal.

The digital PWM signal is further conditioned to generate the drive signals $\varphi_1$ and $\varphi_2$ that are applied to control the switch transistors $M_{P1}$ and $M_{N1}$ of the switch stage 15. The switch transistor $M_N$ has a source connected to the first terminal of the input voltage source 10 and a gate connected to the receive the drive signal $\varphi_1$. The switch transistor $M_{N1}$ has a drain connected to the drain of the switch transistor $M_{P1}$ and to the output terminal of the switch stage 15. The switch transistor $M_{P1}$ has a gate connected to receive the drive signal $\varphi_1$ and the switch transistor $M_{N1}$ has a gated connected to receive the drive signal $\varphi_2$. The output terminal of the switch stage 15 is connected to the input terminal of the filter stage 20 and thus to a first terminal of an inductor L. The second terminal of the inductor L is connected to the first plate of the capacitor CL and to the output terminal 25 of the filter stage 20. The output terminal 25 of the filter stage 20 is connected to the load resistance $R_{LOAD}$. The load current $I_{LOAD}$ is the current flowing through the output terminal 25 to the load resistance $R_{LOAD}$.

FIG. 2 is a schematic of a multiple phase buck switch mode power converter of the related art. The switched-mode converter circuit is structured as a multiphase buck switched-mode converter. The multiphase buck SMPC has a control circuit 105, multiple power stages 115a, ..., 115n, and a filter stage 120. The control circuit 105 receives a feedback voltage indicative of the output voltage $V_{OUT}$ from the output terminal 125 of the multiple stage buck SMPC. The control circuit 105 compares the feedback voltage with a reference voltage and determines and error signal. The error voltage as described above for the single phase buck SMPC is compared with a target reference voltage to determine the difference between the feedback voltage and the target reference voltage to generate the error signal that is indicative of a difference between the output voltage $V_{OUT}$ of the SMPC and the target reference voltage $V_{REF}$. The target reference voltage is a design voltage level for the output voltage $V_{OUT}$ of the SMPC and thus the control stage 105 is structured to minimize the error signal.

The error signal is transferred to a multiple pulse width modulation circuits. Each pulse width modulation circuit is associated with one of the power stages 115a, ..., 115n. The pulse width modulation circuits each generate the drive signals $\varphi_{11}, \varphi_{12}, ..., \varphi_{1n}, \varphi_{1n}$ that are each applied to control the switch transistors $M_{P1}$ and $M_{N1}$ of one of the multiple power stages 115a, ..., 115n.

The switch transistors $M_{P1}$ each have a source that is connected to the first terminal of the input voltage source 110. Each of the gates of the switch transistors $M_{P1}$ and $M_{N1}$ are connected to receive the designated drive signals $\varphi_{11}, \varphi_{12}, ..., \varphi_{1n}, 1n$ for controlling the current flow through the inductor L of the associated phase of the multiple power stages 115a, ..., 115n. The drains of the switch transistors $M_{P1}$ and $M_{N1}$ are connected together and to the first terminal of the inductor L. The sources of the switch transistors MN1 are connected to the ground reference voltage source.

The filter stage is essentially distributed among each of the multiple power stages 115a, ..., 115n. Each of the multiple power stages 115a, ..., 115n has one of the multiple stage inductors $L_1, ..., L_n$ where a first terminal of each of the inductors $L_1, L_2, ..., L_n$ is connected to one the common connection of the drains of the switching transistors MP1 and MN1 of the multiple power stages 115a, ..., 115n. The second terminals of the inductors $L_1, L_2, ..., L_n$ are commonly connected together and to the first plate of a load capacitor $C_L$, thus forming the filter stage. The second plate of the load capacitor $C_L$ is connected to the ground reference voltage source. The commonly connected second terminals of the inductors $L_1, L_2, ..., L_n$ and the first plate of the load capacitor $C_L$ are connected to the load resistance $R_{LOAD}$ through the output terminal 125. The load current $I_{LOAD}$ is the current flowing through the output terminal 125 to the load resistance $R_{LOAD}$. The load current $I_{LOAD}$ is the total current from each of the multiple power stages 115a, ..., 115n.

The control stages 5 and 105 of respectively of FIGS. 1 and 2 in various implementations have other control circuitry for providing compensation signals and other control function for improving noise immunity, energy efficiency, and other operational improvements. Some of these implementations require measurement of the inductor current and the load current. Various techniques for these measurements are known in the art. Some methods are direct measurements by placing known resistors in the current paths and determining the current flow by determining a voltage drop across the resistor. However, this technique is a problem in that integrated circuits, in that the resistance increases power consumption and added voltage drop in the network.

Sensorless current mode (SCM) control is an observer method that provides the operating benefits of current mode control without current physical sensing, as described in "Sensorless Current Mode Control-an Observer-Based Technique for DC-DC Converters," Midya, et al., IEEE Transactions on Power Electronics, vol. 16, no. 4, pp. 522-526, July 2001, found 8/10/13 at http://ieeexplore.ieee.org/stamp/stamp.jsp?tp=&arnumber=931070&isnumber=20140. The observer method constructs a model of the system to be controlled, and then uses state information from the model. In sensorless current mode (SCM) control, an inductor current IL is reconstructed from voltage information. The inductor voltage in a SMPC is usually a far larger signal than the output of a current sensor, and its range does not change much as a function of loading. In its simplest form, the SCM control approach reconstructs an inductor current directly by integrating the inductor voltage.

The voltage drop across the SMPC inductor L is determined and is used to calculate the output current $I_{LOAD}$ using the integration. A mirrored current of the output device is created, and sensed for both NMOS and PMOS currents and then combined. This approach includes the current ripple that needs to be averaged. The integration of the voltage information is used to reconstruct the inductor current. This technique of using a sensorless current sensing scheme results in a slow response time for generating the average current information.

SUMMARY

An object of this disclosure is to provide circuits and methods for determining an instantaneous average load current within a switch mode power converter (SMPC).

To accomplish at least this object, an average load current calculator circuit incorporated within a control circuit of an SMPC that includes at least one phase. The average load current calculator circuit has at least one peak/valley detector configured for receiving a current sense signal from an associated at least one phase of the SMPC indicating the magnitude of the current flowing through an inductor of the at least one phase of the SMPC and configured for determining and holding a peak or valley amplitude of the current sense signal. The average load current calculator circuit has a current error corrector circuit connected for receiving an input voltage and an output voltage of the at least one phase SMPC and configured to receive an inductance value of the inductor of the at least one phase of the SMPC and configured for determining an average correction current of the peak or valley amplitude of the current sense signal from the input voltage, the output voltage and the inductance value.

The at least one peak/valley detector and the current error corrector circuit are connected to an average current generator. For some embodiments, the current error corrector circuit determines a ripple current through the inductors of the at least one phase of the SMPC and then divides the ripple current by one half and transfers the average correction current to the average current generator The average current generator has a summation circuit that sums the peak or valley amplitude of the current sense signal for each of the peak/valley detectors associated with each of the phases of the multiple phases of the SMPC and the average correction current to compute the instantaneous average current of the SMPC. In a single phase SMPC, the average current generator combines the single peak or valley amplitude of the current sense signal with the average correction current.

When the average correction current is determined as one half of the ripple current of the current flowing through an inductor of the at least one phase of the SMPC and the ripple current is determined by the equation:

$$\Delta_{IL} := \frac{V_o\left(1 - \frac{V_o}{V_i}\right)}{L} * T$$

Where:
$\Delta_{IL}$ is the indication of the ripple current;
$V_o$ is the output voltage of the SMPC;
$V_i$ is the input voltage of the SMPC;
T is the switching period of the SMPC;
L is the inductance of the inductor of the at least one phase of the SMPC;

In various embodiments, the peak current information is offset by the slope compensation. Therefore, in these embodiments, the current error corrector circuit in communication with the summation circuit for the current error corrector circuit receives an amplitude indication of a compensation current from the control circuit of the SMPC. The current error corrector circuit is configured for determining the error current by the equation:

$$I_{error} = \frac{V_o\left(1 - \frac{V_o}{V_i}\right)}{2L} * T + I_{COMP} * \frac{V_0}{V_i}T$$

Where:
$I_{error}$ is the indication of the average current error;
$V_o$ is the output voltage of the SMPC;
$V_i$ is the input voltage of the SMPC;
T is the switching period of the SMPC;
L is the inductance of the inductor of the SMPC; and
$I_{comp}$ is the amplitude indication of a compensation current.

In some embodiments, a single error current is determined by the current error corrector circuit and the average load current calculator has a multiplier configured for receiving the indication of the average current error and the number of phases active in the SMPC. The multiplier multiplies the indication of the average current error by the number of phases active to determine the total error current. The total error current is then additively combined in the average current generator with the peak or valley amplitude of the current sense signal to determine instantaneous average load current.

In various embodiments, the current error corrector circuit is a linear current corrector configured for determining a correction current by the equation:

$$I_{COR} = I_{orig} - I_{ped} - G_{fit} * (V_o - V_{min})$$

Where:
$I_{COR}$ is the linear correction current;
$I_{orig}$ is the peak current measurement;
$I_{ped}$ is the current offset at a minimum output voltage;

$G_{fit}$ is an empirically determined constant chosen for best fit;

$V_o$ is the selected output voltage of the SMPC;

$V_{min}$ is the lowest allowed output voltage of the SMPC.

The linear current corrector has a scaled difference calculator configured for calculating the term $G_{fit}*(V_o-V_{min})$. The SMPC output voltage $V_o$ is applied to scaled difference calculator with the empirically determined constant and the lowest allowed output voltage being preprogrammed to the scaled difference calculator.

The linear current corrector has a scaling circuit configured for receiving an indication of the number of the multiple phases of the SMPC, the compensation current, and an indication of the value of the inductance of the inductor of each phase of the multiple phases of the SMPC. The scaling circuit is further configured determining the peak to average adjustment current by subtracting the current offset at a minimum output voltage $I_{ped}$ and the output signal from scaled difference calculator from the peak current measurement.

In other embodiments, the current error corrector circuit is a quadratic current corrector configured for determining a correction current by the equation:

$$I_{error} = \frac{V_o}{2L}T + (n-0.5)*\frac{V_o}{L}*\frac{V_0}{V_i}T$$

Where:

$I_{error}$ is the indication of the average current error;

$V_o$ is the output voltage of the SMPC;

$V_i$ is the input voltage of the SMPC;

T is the switching period of the SMPC;

L is the inductance of the inductor of the SMPC; and n is a constant of proportionality for the slope compensation peak current value.

The quadratic current corrector has a scaled difference calculator configured for calculating the term $$(n-0.5)*\frac{V_o}{L}*\frac{V_0}{V_i}T$$

from the above equation. The SMPC output voltage $V_o$ and the input voltage $V_i$ of the SMPC are applied to the scaled difference calculator with the constant of proportionality n being preprogrammed to the scaled difference calculator.

The quadratic current corrector has a scaling circuit configured for receiving an indication of the number of the multiple phases of the SMPC, the compensation current, and an indication of the value of the inductance of the inductor of each phase of the multiple phases of the SMPC. The scaling circuit is further configured determining the average correction current by adding the slope compensation with the slope compensation peak current value.

The current error corrector circuit has a dynamic slope compensator that is configured for reduction in sub-harmonic oscillations dependent upon the output voltage which in turn is dependent the downward slope of the inductor current. The dynamic slope compensator is configured for receiving the output voltage and determining the amount of the slope compensation current $$Icomp = n*\frac{V_0}{L}T$$

Where:

Icomp is the amplitude indication of a compensation current.

$V_o$ is the output voltage of the SMPC;

n is a constant of proportionality for the slope compensation peak current value;

T is the switching period of the SMPC; and

L is the inductance of the inductor of the SMPC.

In various embodiments, the peak/valley detector that is configured for capturing an amplitude of a maximum variation and a minimum variation in load current of an SMPC. The at least one peak/valley detector is configured for receiving a sensed replication of the inductor current of the phase of the SMPC associated with the peak/valley detector. The peak/valley detector is configured for converting the sensed-replica of the inductor current to an inductor current amplitude voltage and sampling and holding the inductor current amplitude voltage. The peak/valley detector is configured for converting the inductor current amplitude voltage to a current for transfer to a summation circuit. The summation current combines the peak or valley current of at least one phase of the SMPC with an error correction signal for determining the average load current. The peak/valley detection circuit is configured for determining amplitude of the peak current when a current sourcing switch is activated and for determining the amplitude of the valley current when a current sinking switch is activated.

In various embodiments that accomplish at least this object, a switch mode power converter (SMPC) that has at least one phase includes a control circuit having an average load current calculator that is configured for determining a peak and valley of a load current within the phase or phases of the at least one phase of the SMPC and for generating an instantaneous average load current. The average load current calculator is structured as above described.

In various embodiments that accomplish at least this object, a method for calculating average load current of an SMPC begins with sensing the phase currents of the single phase or multiple phases of the an SMPC. The peak or valley current of the single phase or multiple phases of the SMPC are detected and held. The ripple current or the SMPC without slope compensation determined from the input voltage and the output voltage. If an SMPC has slope compensation correction as shown above. The peak currents or valley currents are summed to determine the total current peak current or valley current of the SMPC. The total of the SMPC peak current or valley current is additively combined with the correction currents to determine the instantaneous average current. The instantaneous average current is used either within the SMPC as a control signal of the SMPC. Alternately, the amplitude of the average load current is then transferred to other circuitry for processing optimizing/regulating switching converter feedback control loops, for to determining how much current a load connected to the SMPC is sourcing, and/or for properly balancing load of the multiple phases of a multiple phase SMPC.

BRIEF DESCRIPTION OF THE DRAWINGS

FIG. 16a is a plot of the simulated single phase coil current vs. time of the buck SMPC embodying the principals of this disclosure.

FIG. 16b is a plot of the single phase corrected load sense current of the average current extractor of FIG. 9 as incorporated in a buck SMPC embodying the principals of this disclosure.

FIG. 17 is a plot of the simulated single phase peak to average error after correction of the average current extractor of FIG. 9 as incorporated in a buck SMPC embodying the principals of this disclosure.

DETAILED DESCRIPTION

In the circuits and methods embodying the principals of this disclosure, the actual peak current determined by the SMPC internal feedback loop provides the instantaneous average current information. The load current information is one of the key parameters for switch mode power converters (SMPC) that is often used for optimizing and regulating switching converter feedback control loops. In various applications, the load current information is used for determining how much current by the load connected to an SMPC is sourcing. Additionally, for multiple phase SMPC, the load current information is used to properly balance the load currents in each of the phases. The circuits and methods embodying the principals of this disclosure provide a robust technique for extraction of instantaneous average load current information using coil current information for multiple phase SMPC's. This technique is applicable to all SMPC types, but will be explained explicitly for the buck SMPC.

This disclosure is organized as follows: The first section provides the analytical background of the concept of the principals that embody this disclosure. A second section defines the circuitry of a general embodiment of the concept that embodies the principals this disclosure. A third section defines a preferred embodiment utilizing linear correction circuitry and illustrates the simulation results demonstrating the principals that embody this disclosure.

The fundamental concept embodying the principals of this disclosure consists of extracting average current information from peak or valley information in a multi-phase buck SMPC. The following analysis will employ the peak inductor current $I_{PEAK}$ information for determining the instantaneous average load current $I_{AVG}$, however the calculations would hold for valley current as well. The average load current $I_{AVG}$ is determined according to the equation:

$$I_{AVG} = I_{PEAK} - \frac{\Delta I_L}{2} \quad (1)$$

Where:

$I_{AVG}$ is the instaneous average current;

$I_{PEAK}$ is the peak measurement of the current through the inductor L;

$\Delta I_L$ is the ripple current of the current through the inductor L.

Figure 1:
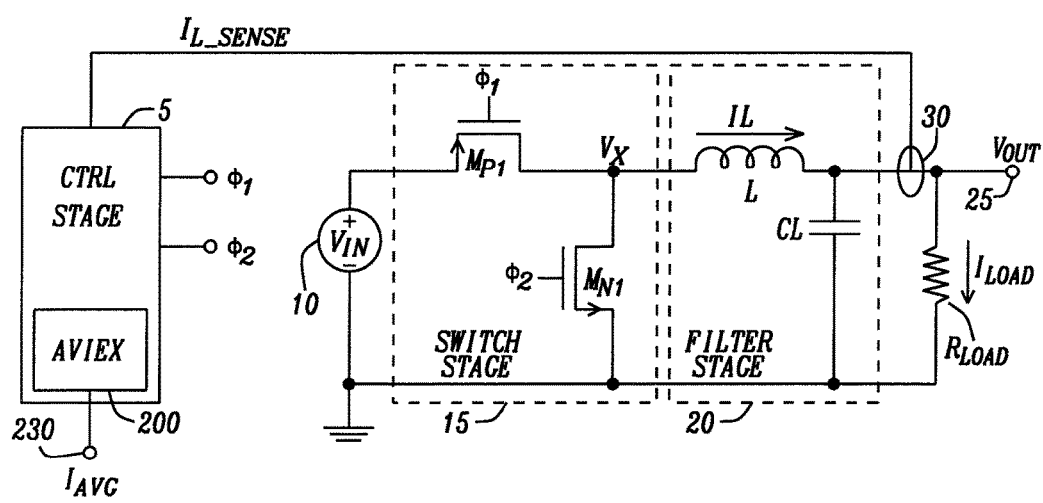
FIG. 1 is a schematic of a buck switch mode power converter embodying the principals of this disclosure.
Figure 2:
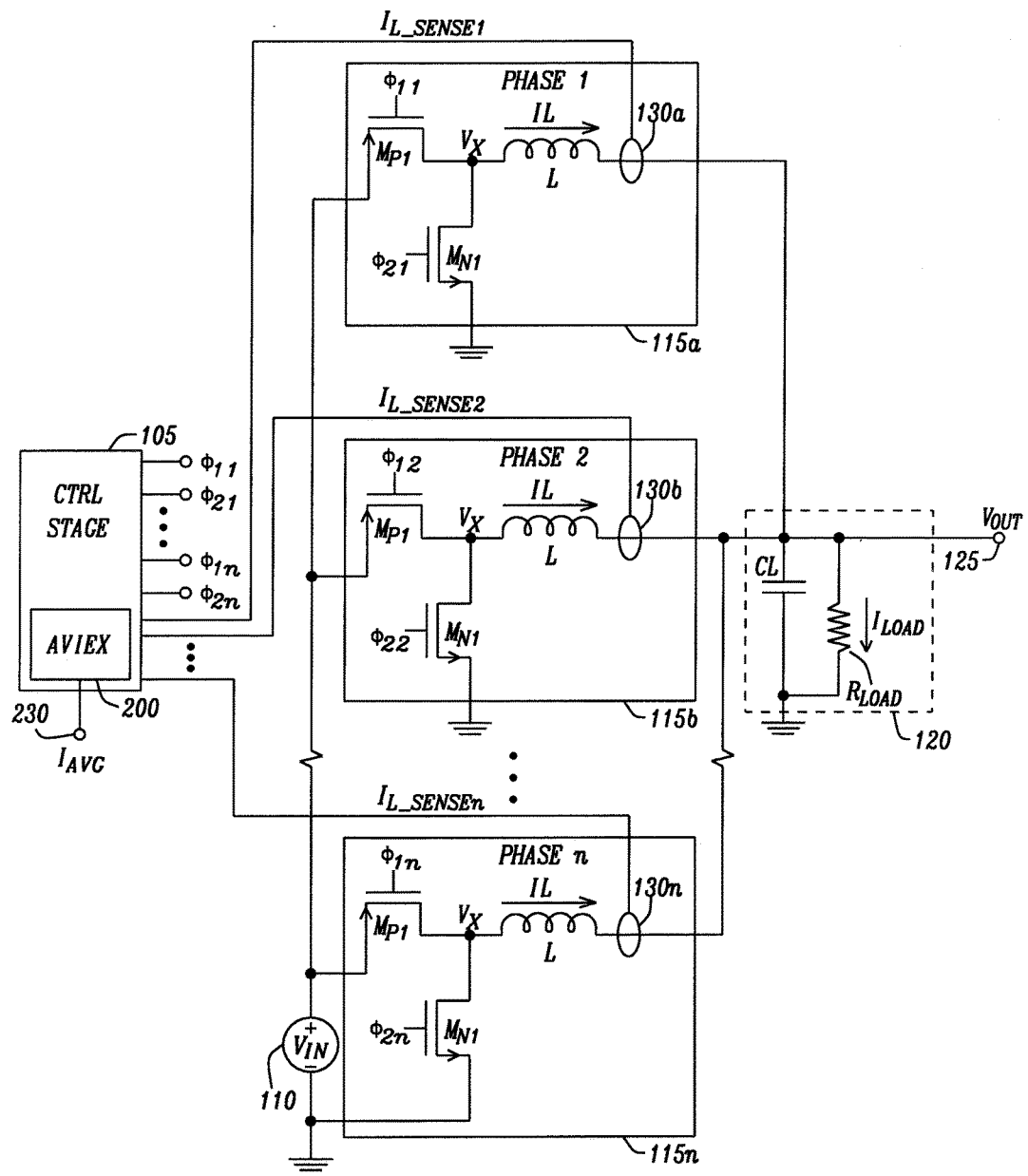
FIG. 2 is a schematic of a multiple phase buck switch mode power converter embodying the principals of this disclosure.

FIG. 1 further illustrates that in various implementations of a buck SMPC, a current sensor 30 is connected to monitor the current flowing IL through the inductor L. The magnitude of the inductor current IL is transferred back to the control stage 5 as the inductor current sense signal $I_{L\_SENSE}$. The inductor current sense signal $I_{L\_SENSE}$ is processed by the control stage 5 for determining the ripple current $\Delta I_L$ component of the inductor current IL. The average current extractor 200 processes the ripple current $\Delta I_L$ to determine the instantaneous average current $I_{AVG}$ as explained hereinafter at the output terminal 230 of the average current extractor 200. Similarly, FIG. 2 illustrates that in various implementations of a multiphase buck SMPC, current sensor 130a, 130b, . . . , 130n is connected to monitor the current flowing IL through each of the inductors L of the multiple power phases 115a, 115b, . . . , 115n. The magnitude of the inductor currents IL is transferred back to the control stage 105 as the inductor current sense signals $I_{L\_SENSE1}$, $I_{L\_SENSE2}, \ldots, I_{L\_SENSEn}$. The inductor current sense signals $I_{L\_SENSE1}, I_{L\_SENSE2}, \ldots, I_{L\_SENSEn}$ are processed by the control stage 5 for determining the ripple current $\Delta I_L$ components of the inductor currents IL. As described for FIG. 1, the average current extractor 200 processes the ripple current $\Delta I_L$ to determine the instantaneous average current $I_{AVG}$ as explained hereinafter.

Figure 3:
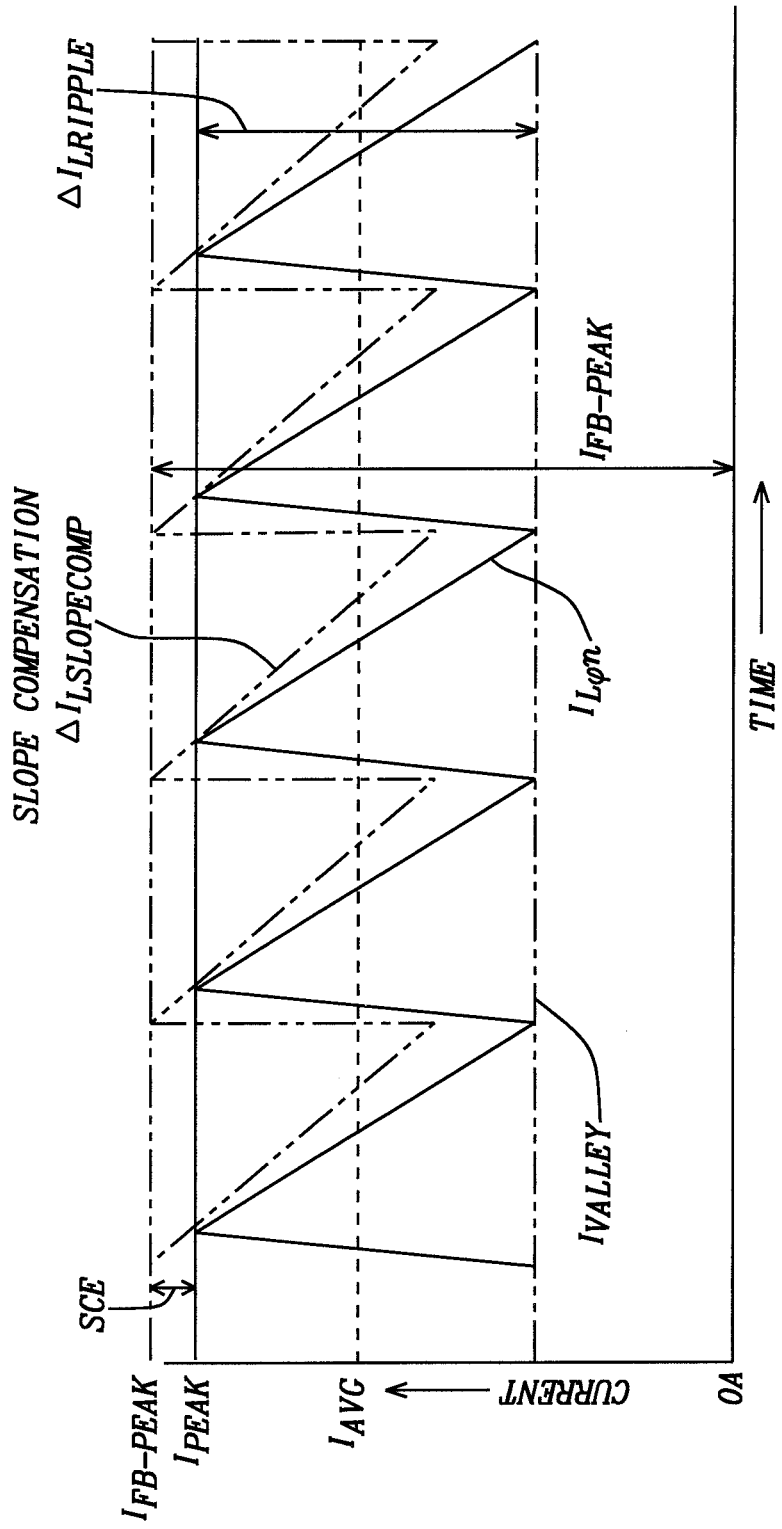
FIG. 3 is a plot of load current vs. time illustrating the peak current and the average current of a buck SMPC embodying the principals of this disclosure.

FIG. 3 is a plot of inductor current $I_{L\varphi n}$ vs. time illustrating the peak current $I_{PEAK}$ and the average current $I_{AVG}$ of a buck SMPC embodying the principals of this disclosure. The correlation between the peak current $I_{PEAK}$ and average current $I_{AVG}$ is that the average current is equal to one-half the ripple current $\Delta I_L$. The variables which the ripple current $\Delta I_L$ are well understood for switching converters. The ripple current $\Delta I_L$ for a switching converter without slope compensation is:

$$\Delta I_L = \frac{V_o\left(1 - \frac{V_o}{V_i}\right)}{L} * T \quad (2)$$

Where:
$V_o$ is the output voltage.
$V_i$ is the input voltage
T is the switching period time.
L is the value of the inductor L
The above technique does not apply for the discontinuous mode of operation for the buck SMPC.

When slope compensation is used, there is an additional factor affecting ripple current $\Delta I_L$. The slope compensation current $\Delta I_{LSLOPECOMP}$ contribution to ripple current $\Delta I_L$ is:

$$\Delta I_{LSLOPECOMP} = I_{COMP} * \frac{V_0}{V_i} T \quad (3)$$

Where
$I_{COMP}$ is the slope compensation peak current.

With the slope compensation, the ripple current $\Delta I_L$ remains as shown in equation (2). Therefore, the peak feedback information to average error for the ripple current $\Delta I_L$ becomes:

$$I_{ERROR} = \frac{V_o\left(1 - \frac{V_o}{V_i}\right)}{2L} * T + Icomp * \frac{V_0}{V_i} T \quad (5)$$

Where:
$I_{ERROR}$ is the average error for the ripple current $\Delta I_L$.
The slope compensation current $\Delta I_{LSLOPECOMP}$ needs to be considered depending on how the peak current $I_{PEAK}$ information is derived. In some designs, the peak current $I_{PEAK}$ information can be directly extracted from the coil current $I_L$. In other designs the peak current $I_{PEAK}$ information is offset by the slope compensation current $\Delta I_{LSLOPECOMP}$.

Normally, the slope compensation peak current $I_{COMP}$ is varied in order to get the best reduction in sub-harmonic oscillations. However, once the best value is found it is fixed. Another approach is to dynamically vary the slope compensation peak current $I_{COMP}$ as the output voltage changes. The ideal slope compensation peak current $I_{COMP}$ is dependent on the output voltage $V_o$ as it depends on the downward slope of the coil current which is dependent on the output voltage $V_o$.

For a critically compensated system slope compensation peak current $$I_{COMP} = 2 * \frac{V_0}{L}.$$

Therefore, slope compensation peak current $I_{COMP}$ can be seen as being proportional to $$\frac{V_0}{L}.$$

By replacing slope compensation peak current $I_{COMP}$ with $$Icomp = n\frac{V_0}{L}$$

then the average error current $I_{error}$ of the ripple current $\Delta I_L$ an be rewritten as:

$$I_{ERROR} := \quad (6)$$
$$\frac{V_o}{2L}T*\left(1 - \frac{V_o}{V_i}\right) + n\frac{V_o}{L} * \frac{V_0}{V_i}T = \frac{Vo*T}{2*L} + n\frac{V_o}{L} * \frac{V_0}{V_i}T - \frac{V_o}{2L} * \frac{Vo*T}{Vi}$$

or $$I_{ERROR} = \frac{V_o}{2L}T + (n - 0.5) * \frac{V_o}{L} * \frac{V_0}{V_i}T \quad (7)$$

In the case of an SMPC system which does not require significant compensation for sub-harmonic oscillations, n can be set to n=0.5. In this case, $\Delta_{IL}$ becomes simply a first order factor of $V_o$ and L and T.

In multi-phase systems when the peak currents are summed, the peak to average current error is multiplied by the number of phases. As a result, the peak to average error compensation must be individually done per phase, or the correction of the summed phases must be corrected accordingly.

For multi-phase SMPC's, the peak current error $$I_{AVG} = I_{PK0} - I_{error0} + I_{PK1} - I_{error1} + \ldots I_{PKn} - I_{errorn} \quad (8)$$

$$I_{AVG} = \Sigma I_{PK} - \Sigma I_{error} \quad (9)$$

The peak inductor current $I_{PEAK}$ to average error current $I_{error}$ gets summed, and therefore when adding or removing phases this error must be corrected accordingly.

$$I_{ERROR} = I_{ERROR0} + I_{ERROR1} + \ldots I_{ERRORn} \quad (10)$$

In multiphase SMPC systems the overall error on the average current measurement is greatly exaggerated. Normally a designer attempts to minimize the coil inductance of a particular buck SMPC. However, for a particular switching frequency, the ripple current $\Delta I_L$ increases as the magnitude of the inductor L decreases. As a result, the ripple current $\Delta I_L$ is normally a significant fraction (1/10-3/10) of the buck's maximum current. In multiphase SMPC systems, in the peak current $I_{PEAK}$ to average current $I_{AVG}$, the correction of the computed average error current $I_{error}$ of the ripple current $\Delta I_L$ must be multiplied by the number of phases. As a result, without correction the peak current $I_{PEAK}$ to average current $I_{AVG}$ error would be a significant fraction of the maximum load current $I_{LOAD}$. This is significant when looking for current measurement accuracy on the order of 10% or below.

Figure 4:
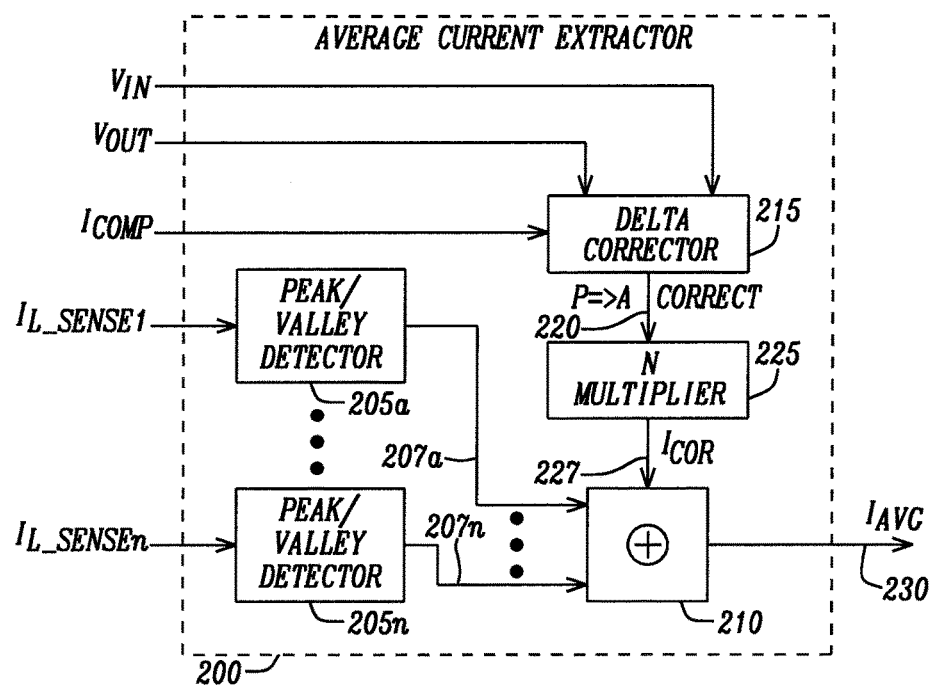
FIG. 4 is a block diagram of an average current extractor incorporated in a buck SMPC embodying the principals of this disclosure.

FIG. 4 is a block diagram of an average current extractor 200 incorporated in a control stage 105 of the buck SMPC's of FIGS. 1 and 2 embodying the principals of this disclosure. The general embodiment provides the SMPC with information regarding the inductor current IL being sourced by each of the multiple power stages 115a, . . . , 115n of the SMPC of FIG. 2. The average current extractor 200 is connected to receive the inductor current sense signals $I_{L\_SENSE1}$, $I_{L\_SENSE2}$, . . . , $I_{L\_SENSEn}$ from the multiple power stages 115a, . . . , 115n. The inductor current sense signals $I_{L\_SENSE1}$, $I_{L\_SENSE2}$, . . . , $I_{L\_SENSEn}$ are each applied to a peak/valley detector 205a, . . . , 205n. The average current extractor 200 embodied in FIG. 1 will have a single peak/valley detector 205a.

Figure 5:
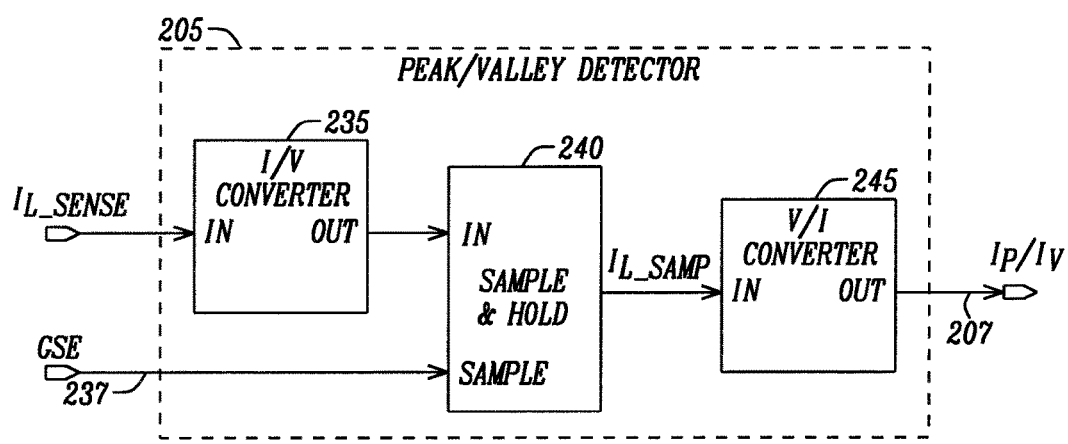
FIG. 5 is a block diagram of a peak/valley detector circuit of the average current extractor of FIG. 4 as incorporated in a buck SMPC embodying the principals of this disclosure.

FIG. 5 is a block diagram of a peak/valley detector circuit 205 of the average current extractor 130 of FIG. 4 as incorporated in a buck SMPC embodying the principals of this disclosure. The inductor current sense signal $I_{L\_SENSE}$ is the input to the current-to-voltage converter 235. The current-to-voltage converter 235 is a transimpedance amplifier that may be implemented using an operational amplifier. The current-to-voltage converter 235 is used with the current sensor 130a, 130b, . . . , 130n that has a current response that is more linear than its voltage response. The current-to-voltage converter 235 is implemented to present a low impedance to the current sensor 130a, 130b, . . . , 130n and isolates it from the output voltage of the current-to-voltage converter 235. The output of the current-to-voltage converter 235 is the input to the sample and hold circuit 240. The sample and hold circuit 240 receives a gate dependent on the output voltage $V_o$ switch event signal (GSE) 237 that acts as the sampling signal for the voltage output $V_{PEAK}$ of the current-to-voltage converter 235. The GSE 237 has a significantly smaller period than the period of the inductor ripple current $\Delta I_L$. The output of the sample and hold of a current sample will be compared with the previous sample. To detect the peak voltage $V_{PEAK}$, when the comparison indicates the present sample of the peak voltage $V_{PEAK}$ is larger than the previous sample, the present sample of the peak voltage $V_{PEAK}$ will be maintained at the at the output. If the current sample of the peak voltage $V_{PEAK}$ is not larger, the previous sample of the peak voltage $V_{PEAK}$ is maintained at the output of the sample and hold circuit. To detect the valley voltage $V_{VALLEY}$ of FIG. 3, when the present sample of the valley voltage $V_{VALLEY}$ is less than the previous sample, the current sample of the valley voltage $V_{VALLEY}$ will be maintained at the output of the sample and hold circuit 240. If the current sample of the peak voltage $V_{PEAK}$ is larger, the previous sample of the valley voltage $V_{PEAK}$ is maintained at the output of the sample and hold circuit 240. The output signal $V_{L\_SAMP}$ of the sample and hold circuit 240 will be either the peak voltage $V_{PEAK}$ or the valley voltage $V_{VALLEY}$ and is transferred to the voltage-to-current converter 245. The voltage-to-current converter 245 is essentially a voltage controlled current source where the output terminal 207 sources the peak current $I_{PEAK}$ amplitude signal or the valley current $I_{VALLEY}$ amplitude as determined by the sample and hold circuit 240. The amplitude of the voltage of the output signal $V_{L\_SAMP}$ of the sample and hold circuit 240 determines the peak current $I_{PEAK}$ amplitude signal or the valley current $I_{VALLEY}$ amplitude signal based on a gain factor of the voltage-to-current converter 245.

Returning to FIG. 4, the output terminals 207a, 207b, . . . , 207n of the peak/valley detectors 205a, . . . , 205n provide the peak current $I_{PEAK}$ amplitude signal or the valley current $I_{VALLEY}$ amplitude signal for each of the multiple power stages 115a, . . . , 115n of the multiphase SMPC to the additive combining circuit 210. The additive combining circuit 210 receives a correction current $I_{COR}$ on the connection 262 from the correction inductor ripple current $\Delta I_L$ correction block 215 to be additively combined with the peak current $I_{PEAK}$ amplitude signals or the valley current $I_{VALLEY}$ amplitude signals from the peak/valley detectors 205a, . . . , 205n to determine the average current $I_{AVG}$ that is placed at the output terminal 230 of the average current extractor 200 for transfer to external circuitry.

The inductor ripple current $\Delta I_L$ correction block 215 corrects the errors between peak and average current measurements using the theoretically expected behaviour of the circuit as defined in equations (6) and (9). The circuit may deviate from the theoretically expected behaviour due to errors in the peak detection, summing and/or multiplication inaccuracies. The inductor ripple current $\Delta I_L$ correction block 215 may be made very simple or more complex depending on the accuracy required as well as the input voltage $V_i$, output voltage $V_o$, inductor L tolerance, and slope compensation characteristics of the DC/DC converter.

Figure 6:
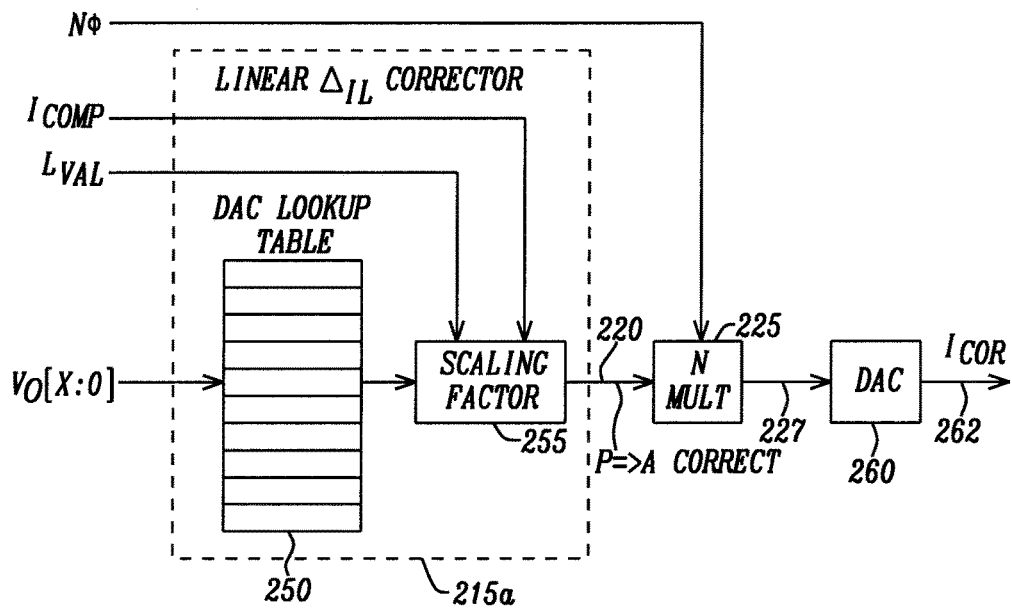
FIG. 6 is a block diagram of a linear implementation of the inductor ripple current correction block of the average current extractor of FIG. 4 as incorporated in a buck SMPC embodying the principals of this disclosure.

FIG. 6 is a block diagram of a linear implementation of the inductor ripple current $\Delta I_L$ correction block 215a of the average current extractor of FIG. 4 as incorporated in a buck SMPC embodying the principals of this disclosure. The inductor ripple current $\Delta I_L$ correction block 215a is a linear correction circuit that determines the required correction current $I_{COR}$ at the output terminal 262 of the digital-to-analog converter 260. The inductor ripple current $\Delta I_L$ correction block 215a in conjunction with the number of phases multiplier circuit 225 determines the total peak-to-average correction current value 227. The total peak-to-average correction current value 227 is applied to the digital-to-analog converter 260 that converts the peak-to-average correction current value 227 to the correction current $I_{COR}$.

The inductor ripple current $\Delta I_L$ correction block 215a is configured for determining a correction current by the equation:

$$I_{COR} = I_{orig} - I_{ped} - G_{fit} * (V_o - V_{min}) \qquad (11)$$

Where:
$I_{COR}$ is the linear correction current;
$I_{orig}$ is the peak current measurement;
$I_{ped}$ is the current offset at a minimum output voltage;
$G_{fit}$ is an empirically determined constant chosen for best fit;
$V_o$ is the selected output voltage of the SMPC;
$V_{min}$ is the lowest allowed output voltage of the SMPC.

The inductor ripple current $\Delta I_L$ correction block 215a has a digital-to-analog lookup table 250 that is addressed by a digitized value $V_o[X:0]$ of the output voltage $V_o$ for accessing the contents of the digital-to-analog lookup table 250 that is the value of the term $G_{fit} * (V_o - V_{min})$. A digital-to-analog lookup table 250 is the fastest way of implementing a digital subtraction. The digital value of the term $G_{fit} * (V_o - V_{min})$ is the input to the scaling factor circuit 255. The scaling factor circuit 255 receives the digital values L of the inductor L and the digital value of the compensation current Icomp. The digital values L of the inductor L and the digital value of the compensation current Icomp are combined with the term $G_{fit}*(V_o-V_{min})$ to form the peak-to-average correction factor 220 for a single phase of the SMPC. The single phase peak-to-average correction factor 220 is applied to the number of phases multiplier circuit 225. The number of phases multiplier circuit 225 multiplies the single phase peak-to-average correction factor 220 by the number of phases signal NΦ to form the digital value of the total phase peak-to-average correction factor 227. The total phase peak-to-average correction factor 227 is applied to the digital-to-analog converter to generate the correction current $I_{COR}$.

Figure 7:
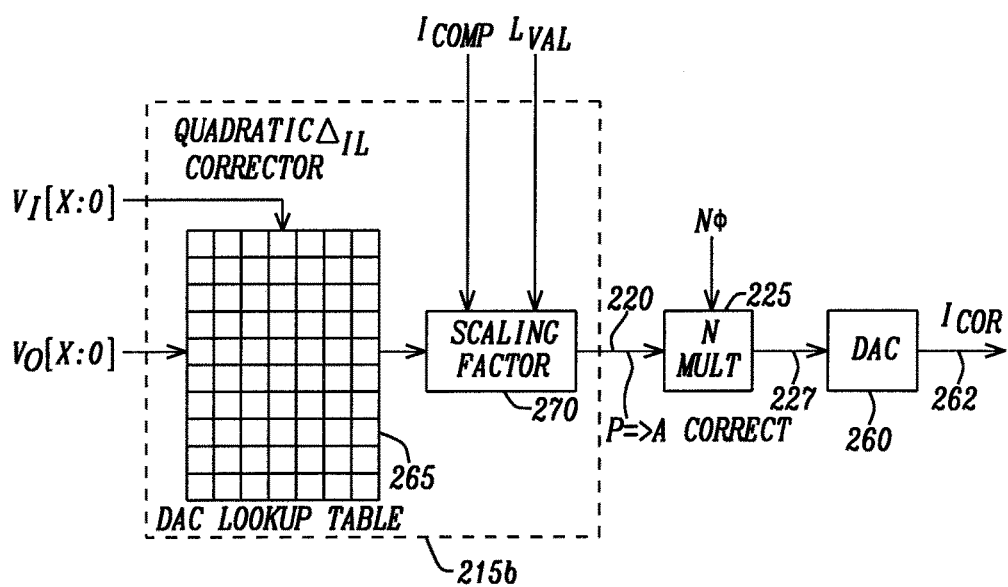
FIG. 7 is a block diagram of a quadratic implementation of the inductor ripple current correction block of the average current extractor of FIG. 4 as incorporated in a buck SMPC embodying the principals of this disclosure.

FIG. 7 is a block diagram of a quadratic implementation of the inductor ripple current $\Delta I_L$ correction block 215b of the average current extractor of FIG. 4 as incorporated in a buck SMPC embodying the principals of this disclosure. As in FIG. 6, the error correction current $I_{COR}$ is determined by the solution of Equation (7), except now the term $$\left(n\frac{V_o}{L}*\frac{V_0}{V_i}T - \frac{V_o}{2L}*\frac{V_o*T}{V_i}\right)$$

is solved using both the digitized value $V_o[X:0]$ of the output voltage $V_o$ and digitized value $V_i[X:0]$ of the input voltage $V_i$. The digitized value $V_o[X:0]$ of the output voltage $V_o$ addresses the rows of the digital-to-analog lookup table 265 and the digitized value $V_i[X:0]$ of the input voltage $V_i$ addresses the columns of the digital-to-analog lookup table 265. The contents of each cell of the digital-to-analog lookup table 265 is the value of the term $$\left(n\frac{V_o}{L}*\frac{V_0}{V_i}T - \frac{V_o}{2L}*\frac{V_o*T}{V_i}\right)$$

of Equation (6). The digital term $$\left(n\frac{V_o}{L}*\frac{V_0}{V_i}T - \frac{V_o}{2L}*\frac{V_o*T}{V_i}\right)$$

from Equation (6) at the output of the digital-to-analog lookup table 265 is applied to the input of the scaling factor circuit 270. The scaling factor circuit 270 receives the digital values L of the inductor L and the digital value of the compensation current Icomp. The digital values L of the inductor L and the digital value of the compensation current Icomp are combined with the term $$\left(n\frac{V_o}{L}*\frac{V_0}{V_i}T - \frac{V_o}{2L}*\frac{V_o*T}{V_i}\right)$$

to form the peak-to-average correction factor 220 for a single phase of the SMPC. The single phase peak-to-average correction factor 220 is applied to the number of phases multiplier circuit 225. The number of phases multiplier circuit 225 multiplies the single phase peak-to-average correction factor 220 by the number of phases signal NΦ to form the digital value of the total phase peak-to-average correction factor 227. The total phase peak-to-average correction factor 227 is applied to the digital-to-analog converter to generate the correction current $I_{COR}$.

Figure 8:
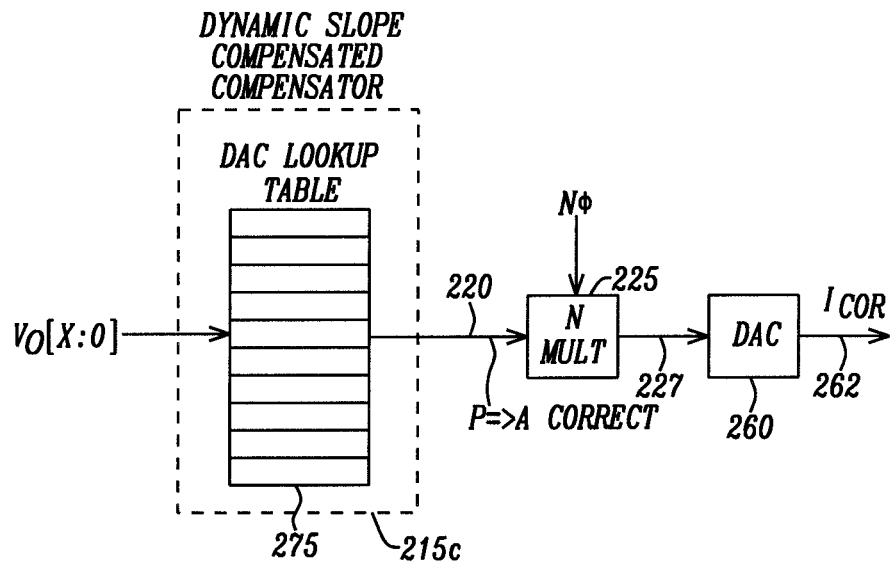
FIG. 8 is a block diagram of a dynamic slope compensation implementation of the inductor ripple current correction block of the average current extractor of FIG. 4 as incorporated in a buck SMPC embodying the principals of this disclosure.

FIG. 8 is a block diagram of a dynamic slope compensated compensation circuit 215c implementation of the inductor ripple current $\Delta I_L$ correction block 215 of the average current extractor of FIG. 4 as incorporated in a buck SMPC embodying the principals of this disclosure. In an SMPC that is designed dynamic slope compensation, the dynamic slope compensation adjusts the systems slope compensation as a function of the output voltage. As a result, the peak to average current compensation may become a linear relationship of the output voltage. Dynamic slope compensation may be used for SMPC's with a low maximum duty cycle. Thus, a low value for slope compensation may be used where the slope compensation multiplier "n" as defined in Equation (7) may be set to n=1, or lower. In this case, the slope compensation current Icomp is dynamically adjusted such that:

$$Icomp := \frac{V_0}{L}T \qquad (12)$$

Then the slope compensation error $\Delta I_L$ reduces to:

$$\Delta_{IL} := \frac{V_o}{L}T + (1-1)*\frac{V_o}{L}*\frac{V_0}{V_i}T \qquad (13)$$

Or $$\Delta_{IL} := \frac{V_o}{L}T \qquad (14)$$

This allows for very accurate correction current $I_{COR}$ using a linear correction algorithm. The dynamic slope compensated compensation circuit 215c has a digital-to-analog lookup table 275 that receives the digitized value $V_o[X:0]$ of the output voltage $V_o$ to address the digital-to-analog lookup table 275. The contents of each cell location of the digital-to-analog lookup table 275 is the solution to the Equation (14) that is now the peak-to-average correction factor 220 for the single phase of the SMPC. The single phase peak-to-average correction factor 220 is applied to the number of phases multiplier circuit 225. The number of phases multiplier circuit 225 multiplies the single phase peak-to-average correction factor 220 by the number of phases signal NΦ to form the digital value of the total phase peak-to-average correction factor 227. The total phase peak-to-average correction factor 227 is applied to the digital-to-analog converter to generate the correction current $I_{COR}$.

Figure 9:
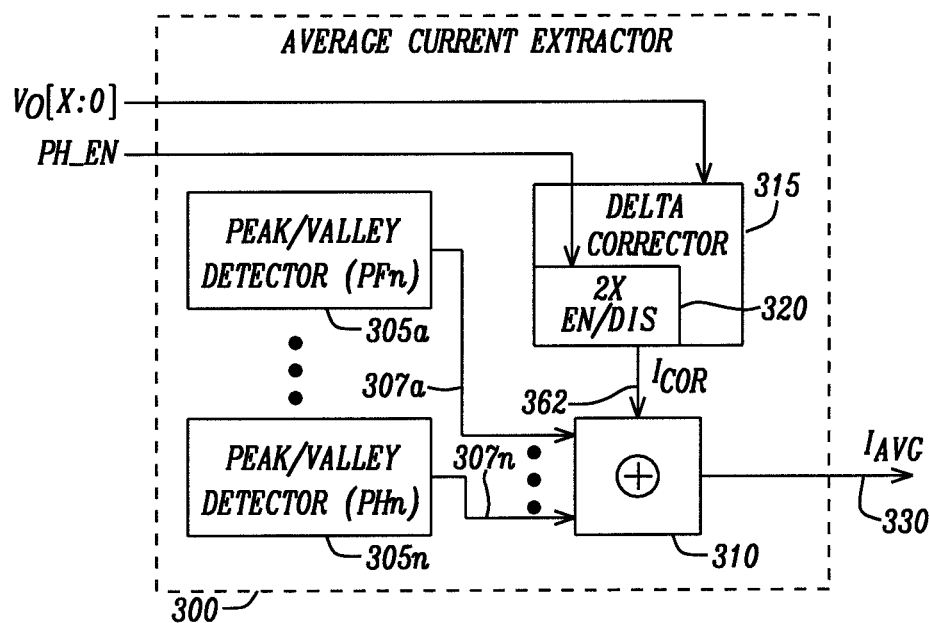
FIG. 9 is a block diagram of a preferred implementation of an average current extractor as incorporated in a buck SMPC embodying the principals of this disclosure.

FIG. 9 is a block diagram of a preferred implementation of an average current extractor 300 as incorporated in a buck SMPC embodying the principals of this disclosure. The fundamental structure of the average current extractor 300 is fundamentally identical to that of the average current extractor 200 of FIG. 4. The peak/valley detectors 305a, . . . , 305n are structured and function as shown in FIG. 5. The inductor ripple current $\Delta I_L$ correction block 315 receives the digitized value $V_o[X:0]$ of the output voltage $V_o$ and the phase enable/disable signal PH_EN. The phase enable/disable signal PH_EN is set such that the circuit is functioning for either a single phase or two-phase SMPC. The output 362 of the inductor ripple current $\Delta I_L$ correction block 315 transfers the correction current $I_{COR}$ to the additive combining circuit 310. The additive combining circuit 310 receives a correction current $I_{COR}$ on the connection 362 from the inductor ripple current $\Delta I_L$ correction block 315 to be additively combined with the peak current $I_{PEAK}$ amplitude signals or the valley current $I_{VALLEY}$ amplitude signals from the peak/valley detectors 305a, ..., 305n to determine the average current $I_{AVG}$ that is placed at the output terminal 330 of the average current extractor 300 for transfer to external circuitry.

The inductor ripple current $\Delta I_L$ correction block 315 in this implementation uses a linear correction approach generates the correction current $I_{COR}$. Even though the error due to the output voltage $V_o$ and the input voltage $V_i$ changes quadratically as shown in equation (4), a reasonable reduction in the peak to average error has been achieved by using a best fit linear correction. For the linear correction, a generic best fit linear equation is used. The linear equations parameters are adjusted empirically to obtain the best fit with the simulated/computed peak to average current error. The generalized linear correction equation is shown in equation (11).

Figure 10:
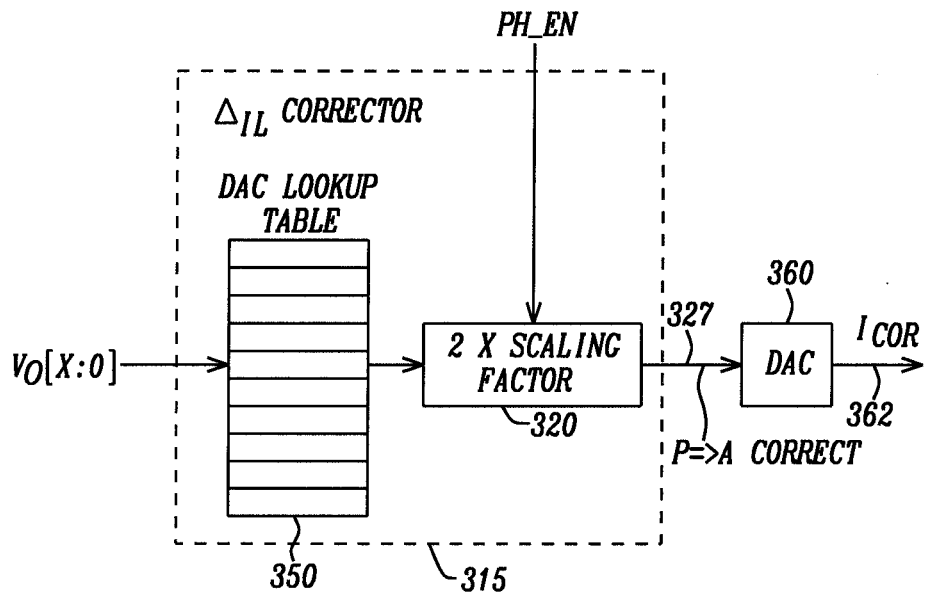
FIG. 10 is a block diagram of a ripple current correction circuit of the preferred implementation of the average current extractor of FIG. 9 as incorporated in a buck SMPC embodying the principals of this disclosure.

FIG. 10 is a block diagram of a inductor ripple current $\Delta I_L$ correction block 315 of the preferred implementation of the average current extractor of FIG. 9 as incorporated in a buck SMPC embodying the principals of this disclosure. The digitized value $V_o[X:0]$ of the output voltage $V_o$ is applied to the digital-to-analog lookup table 350. The contents of each cell location of the digital-to-analog lookup table 250 contain the term $I_{ped}-G_{fit}*(V_o-V_{min})$ that is transferred to the output of the digital-to-analog lookup table 350 and then to the input of the scaling circuit 335. The scaling circuit 335 receives the phase enable/disable signal PH_EN indicating that the scaling circuit 335 is functioning with either a single phase or two-phase SMPC. The phase enable/disable signal PH_EN is applied to the scaling circuit 335 to enable or disable the scaling circuit for the functioning with the single phase or two-phase SMPC. If the scaling circuit 335 functions with a single phase SMPC, the peak-to-average correction signal is the contents of the addressed cell location of the digital-to-analog lookup table 250 as applied to the scaling circuit 320. The scaling circuit 335 disables the multiplication and the contents of the addressed cell location are transferred as the peak-to-average correction current value P⇒A the output 327 of the scaling circuit 335. If the scaling circuit 335 functions with the two-phase SMPC, the peak-to-average correction signal is the contents of the addressed cell location of the digital-to-analog lookup table 250 as applied to the scaling circuit 320. The scaling circuit multiplies the contents of the addressed cell location by a factor of 2 and transfers to the peak-to-average correction current value P⇒A at the output 327 of the scaling circuit 335. The peak-to-average correction current value P⇒A at the output 327 of the scaling circuit 335 is applied to the input of the digital-to-analog converter 327 which convert the digital peak-to-average correction current value P⇒A to the analog correction current $I_{COR}$.

Returning to FIG. 9, the analog correction current $I_{COR}$ at the output 362 of the inductor ripple current $\Delta I_L$ correction block 315 is applied to the additive combining circuit 310 to be additively combined with the peak current $I_{PEAK}$ amplitude signals or the valley current $I_{VALLEY}$ amplitude signals from the peak/valley detectors 305a, ..., 305n to determine the average current $I_{AVG}$ that is placed at the output terminal 330 of the average current extractor 300 for transfer to external circuitry.

Figure 11:
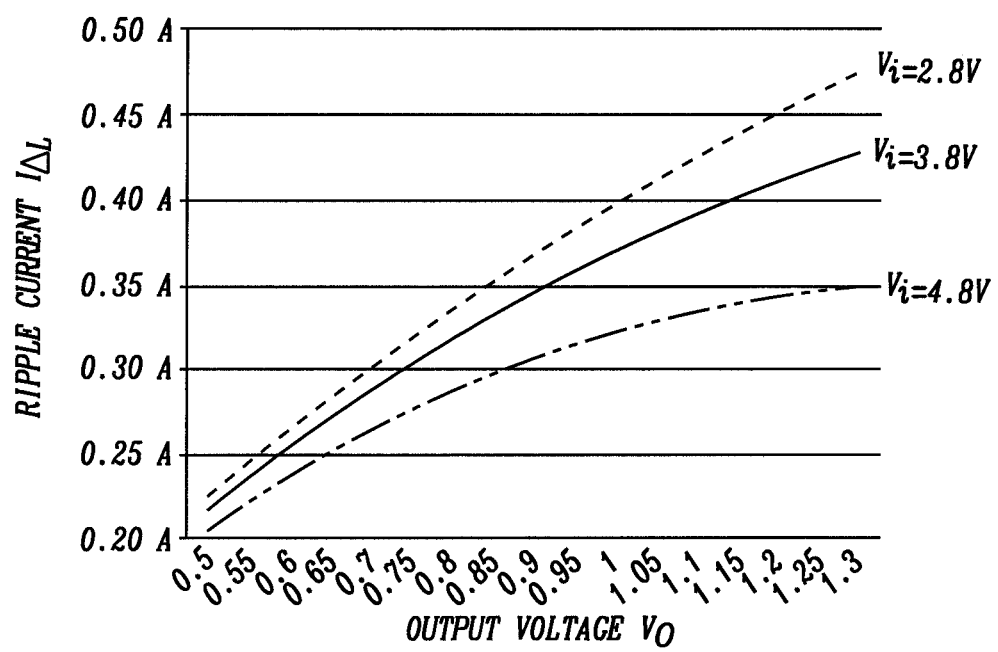
FIG. 11 is a plot of computed ripple current vs output voltage for various input voltages of a buck SMPC prior to current correction.
Figure 12:
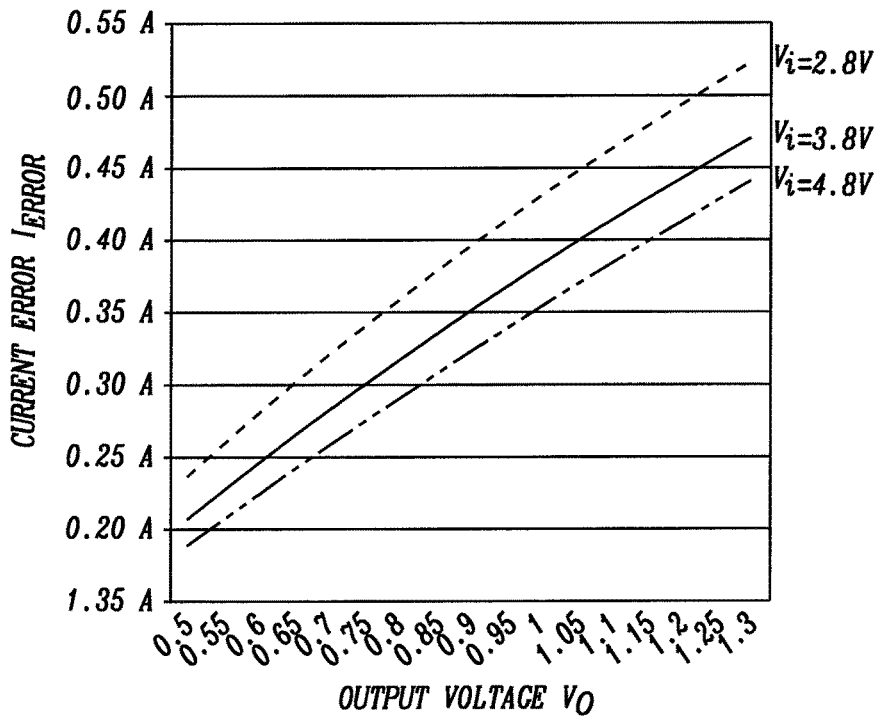
FIG. 12 is a plot of computed peak to average current error vs output voltage for various input voltages of a buck SMPC prior to current correction.
Figure 13:
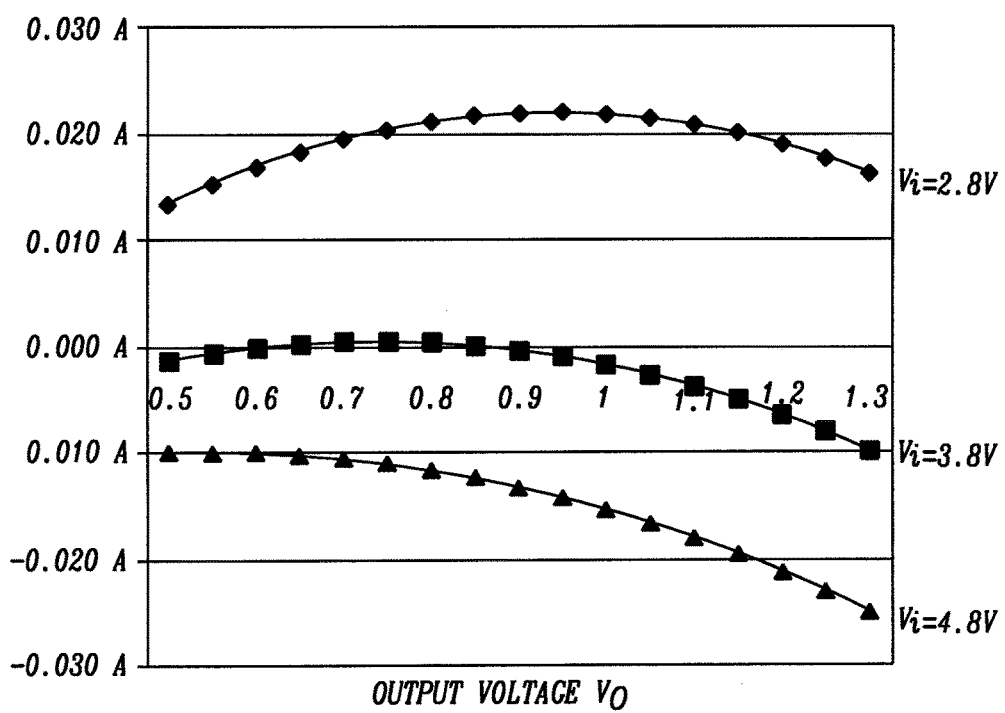
FIG. 13 is a plot of computed peak to average current error after correction vs output voltage for various input voltages of a buck SMPC embodying the principals of this disclosure.

In the preferred implementation of FIG. 9, the correction scheme that reduces the error at typical operating conditions was chosen. The SMPC is designed to have a value of the inductor L equal to 1 µH and a compensation current Icomp equal to 1.5 MA/s. The linear correction was first determined using computed peak-to-average errors and then empirically adjusted using simulation results. FIG. 11 is a plot of computed ripple current $\Delta I_L$ vs output voltage $V_o$ for input voltages $V_i$ of 2.8V, 3.8V, and 4.8V of a buck SMPC prior to current correction. FIG. 12 is a plot of computed peak to average current error $I_{ERROR}$ vs output voltage $V_o$ for input voltages $V_i$ of 2.8V, 3.8V, and 4.8V of the buck SMPC prior to current correction. FIG. 13 is a plot of computed peak to average correction current error $I_{COR}$ vs output voltage $V_o$ for input voltages $V_i$ of 2.8V, 3.8V, and 4.8V of a buck SMPC embodying the principals of this disclosure.

Referring above to Equation (11), it can be shown from equation (5) that the ripple current ripple current $\Delta I_L$ is zero only when the output voltage $V_o$ is 0V, or equal to the input voltage $V_i$. As a result, a current offset $I_{ped}$ is introduced in the equation to provide for a better linear fit. $G_{fit}$ is an empirically determined constant chosen for best fit. The specific correction algorithm used in this example is $$I_{adj}:=I_{orig}-0.16-0.24*(V_o-0.5) \qquad (15)$$

Figure 14:
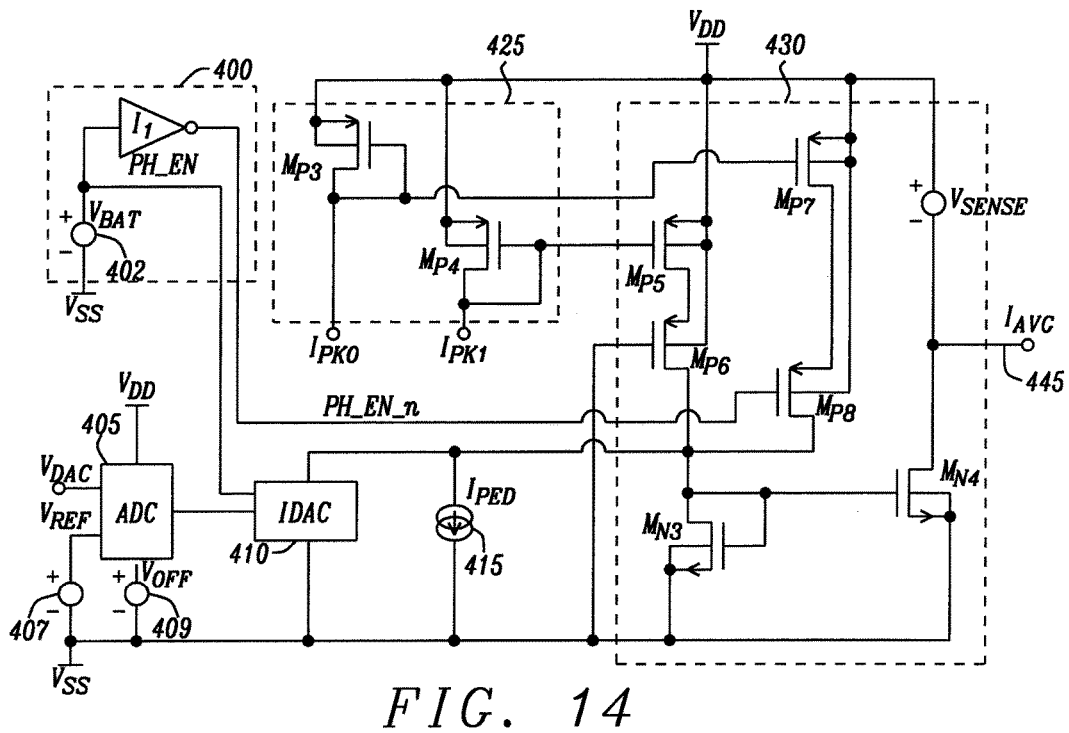
FIG. 14 is a schematic drawing of a test bench error correction circuit for simulating the preferred implementation of the average current extractor of FIG. 9 as incorporated in a buck SMPC embodying the principals of this disclosure.

The circuit of FIG. 9 has been evaluated be accurate within ±30 mA as shown in FIG. 13. The result is quite accurate for current load $I_L$ which may range from 0-2 A per phase. To further evaluate the average current extractor 300 as incorporated in a buck SMPC of FIG. 9, the average current extractor 300 as incorporated in a buck SMPC was simulated to assess the computed results. FIG. 14 is a schematic drawing of a test bench circuit for simulating the preferred implementation of the average current extractor 300 of FIG. 9. The test bench circuit has a phase enable/disable generator 400 for creating the phase enable/disable signal PH_EN. The voltage source 402 is connected between the substrate voltage source $V_{SS}$ and the input to inverter $I_1$. The voltage source 402 supplies the voltage $V_{BAT}$ and forms the phase enable/disable signal PH_EN. The inverter $I_1$ complements the phase enable/disable signal PH_EN to form the logical complement PH_EN_n of phase enable/disable signal PH_EN.

The analog input voltage $V_{DAC}$ is applied to the current analog-to-digital converter 405. The reference voltage source 407 generates the reference voltage $V_{REF}$ that is also applied to the analog-to-digital converter 405. The current analog-to-digital converter 405 transforms the analog input voltage $V_{DAC}$ to a digital representation of the analog input voltage $V_{DAC}$ that applied to an input of the current digital-to-analog converter 410. The phase enable/disable signal PH_EN is applied as a second input of the current digital-to-analog converter 410. An offset voltage source 409 generates an offset voltage $V_{OFF}$ that is an input to the of the current digital-to-analog converter 410 for use in the test bench to vary operation based on the offset voltage $V_{OFF}$. The reference voltage source 407 and the offset voltage source 409 connected to the substrate reference voltage $V_{SS}$.

The output of the current analog-to-digital converter 405 is a current input to the correction circuit 430. A current source 415 generates the offset current $I_{PED}$ that is present at the minimum level of the output voltage $V_{OUT}$.

The peak current generator 425 generates the peak currents $I_{PK0}$ and $I_{PK1}$ that represent the peak and valley currents $I_{PK0}$ and $I_{PK1}$ as detected by the peak/valley detector 205 of FIG. 4. The diode connected PMOS transistors $M_{P3}$ and $M_{P4}$ that source the peak and valley currents $I_{PK0}$ and $I_{PK1}$. The diode connected PMOS transistors $M_{P3}$ and $M_{P4}$ are reference legs that provide the reference currents for the average current correction circuit 430. The level of the peak and valley currents $I_{PK0}$ and $I_{PK1}$ are set externally at the output terminals of the peak current generator 425. The sources of the diode connected PMOS transistors $M_{P3}$ and $M_{P4}$ are connected to the input power supply voltage source $V_I$. The gates and drains of the diode connected PMOS transistors $M_{P3}$ and $M_{P4}$ are connected to the output terminals of the peak current generator 425 and to the inputs of the average current correction circuit 430.

The average current correction circuit 430 receives the complement phase enable/disable signal PH_EN_n and the output of the current digital-to-analog converter 410. The output of the current digital-to-analog converter 410 is applied to the drain of the PMOS transistor $M_{P8}$ and the complement phase enable/disable signal PH_EN_n is applied to the gate of the PMOS transistor $M_{P8}$. The source of the PMOS transistor $M_{P8}$ is applied to the drain of the PMOS transistor $M_{P7}$. The gate of PMOS transistor $M_{P7}$ is connected to the gate and drain of the PMOS transistor $M_{P3}$ and the PMOS transistor $M_{P7}$ performs the mirror leg function of the current mirror formed with the PMOS transistor $M_{P3}$.

The output of the current digital-to-analog converter 410 is applied to the drain of the PMOS transistor $M_{P8}$ and the gate of the PMOS transistor $M_{P8}$ is connected to the substrate voltage source $V_{SS}$. The source of the PMOS transistor $M_{P8}$ is connected to the drain of the PMOS transistor $M_{P8}$. The gate of the PMOS transistor $M_{P5}$ is connected to the gate and drain of the PMOS transistor $M_{P4}$ and the PMOS transistor $M_{P5}$ performs the mirror leg function of the current mirror formed with the PMOS transistor $M_{P4}$. The sources of the diode connected PMOS transistors $M_{P8}$ and $M_{P7}$ are connected to the power supply voltage source $V_{DD}$.

The drain of the NMOS transistor $M_{N3}$ is connected to receive the output of the current digital-to-analog converter 410, connected to the drains of the PMOS transistor $M_{P8}$ and the PMOS transistor $M_{P8}$ to receive the mirror currents of the two current sources. The mirror current through the PMOS transistor $M_8$ is dependent on the state of the complement phase enable/disable signal PH_EN_n for turning on or turning off the PMOS transistor $M_{P8}$ for controlling the current through the NMOS transistor $M_{N3}$.

The gate and drain of the NMOS transistor $M_{N3}$ are connected and to the gate of the NMOS transistor $M_{N4}$. The NMOS transistor $M_{N3}$ and the NMOS transistor $M_{N4}$ form a current mirror with the \NMOS transistor $M_{N3}$ being the reference leg sinking the current from the current digital-to-analog converter 410 and the currents from the current mirror formed by the PMOS transistor $M_{P4}$ and the PMOS transistor $M_{P8}$ and the current mirror formed by the PMOS transistor $M_{P3}$ and the PMOS transistor $M_{P7}$. The NMOS transistor $M_{N4}$ is the reference leg of the current mirror that provides the correction current $I_{COR}$ to develop the instantaneous average current $I_{AVG}$ at the output of the inductor ripple current $\Delta I_L$ correction block 215.

Figure 15:
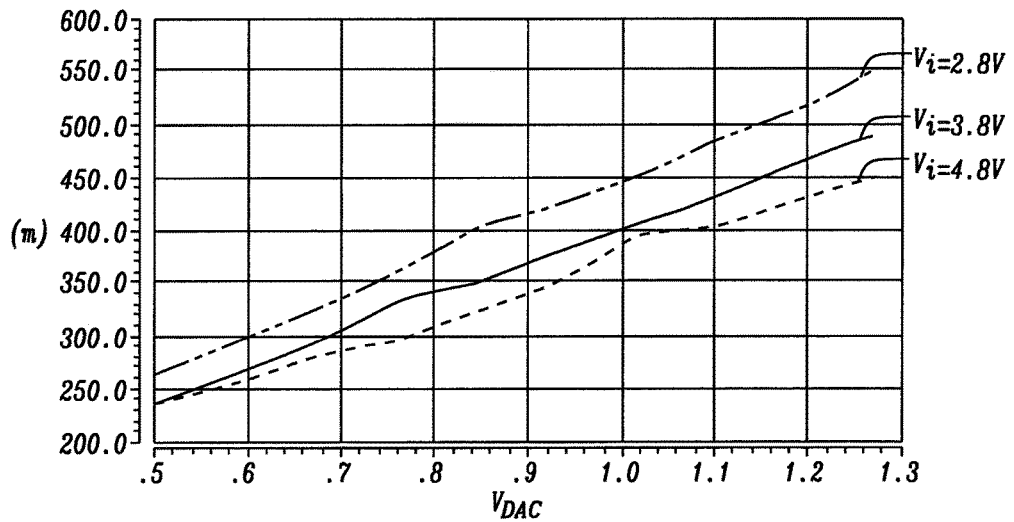
FIG. 15 is a plot of the simulated average current error of the average current extractor of FIG. 9 as incorporated in a buck SMPC embodying the principals of this disclosure.

FIG. 15 is a plot of the simulated average current error ($I_{PK}-I_{AVG}$) of the average current extractor of FIG. 9 vs. the analog input voltage $V_{DAC}$ of the test bench circuit of FIG. 14 as incorporated in a buck SMPC. The analog input voltage $V_{DAC}$ is swept to represent the SMPC output voltage $V_o$. The ripple current ripple current $\Delta I_L$ changes as a function of SMPC output voltage $V_o$ and SMPC input voltage Viand thus the average error current $I_{error}$ changes with vout and vbat. FIG. 15 sweeps illustrates the sweep of the SMPC output voltage $V_o$ on the x-axis and input voltage $V_i$ is plotted as the separate plots of $V_i$=2.8V, $V_i$=3.8V and $V_i$=4.8V.

FIG. 16*a* is a plot of the simulated single phase SMPC coil current vs. time of the SMPC. FIG. 16*b* is a plot of the single phase SMPC corrected load sense current of the average current extractor of FIG. 9 as incorporated in an SMPC. FIG. 16*a* is a transient simulation from the single phase SMPC showing the coil current IL. FIG. 16*b* is the transient simulation from a single phase SMPC showing the corrected correction current $I_{COR}$. The transient simulations for FIGS. 16*a* and 16*b* are repeated for various SMPC input voltage Viand SMPC output voltage $V_o$ values. It will be noted that the spread of the corrected correction current $I_{COR}$ is very little.

FIG. 17 is a plot of the simulated single phase peak to average error after correction of the average current extractor of FIG. 9 as incorporated in an SMPC as extracted from transient simulation of FIGS. 16*a* and 16*b*. FIG. 17 shows the SMPC output voltage $V_o$ on the x-axis and input voltage $V_i$ is plotted as the separate plots of $V_i$=2.8V, $V_i$=3.8V and $V_i$=4.8V showing the improvement in the average error current $I_{error}$.

Figure 18A:
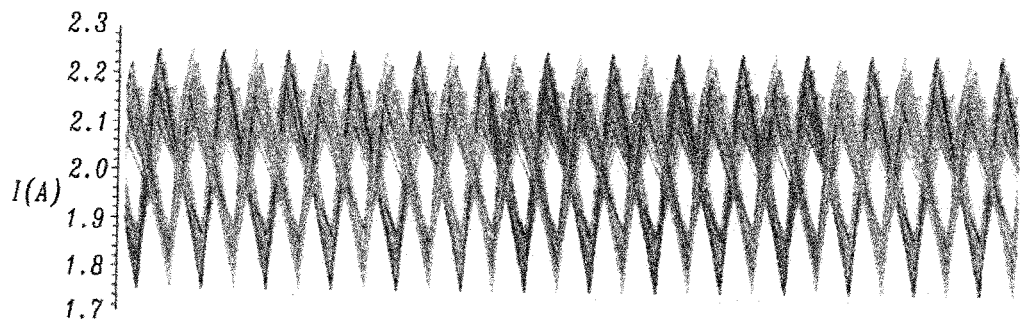
FIG. 18a is a plot of the simulated dual phase coil current of the average current extractor of FIG. 9 as incorporated in a buck SMPC embodying the principals of this disclosure.
Figure 18B:
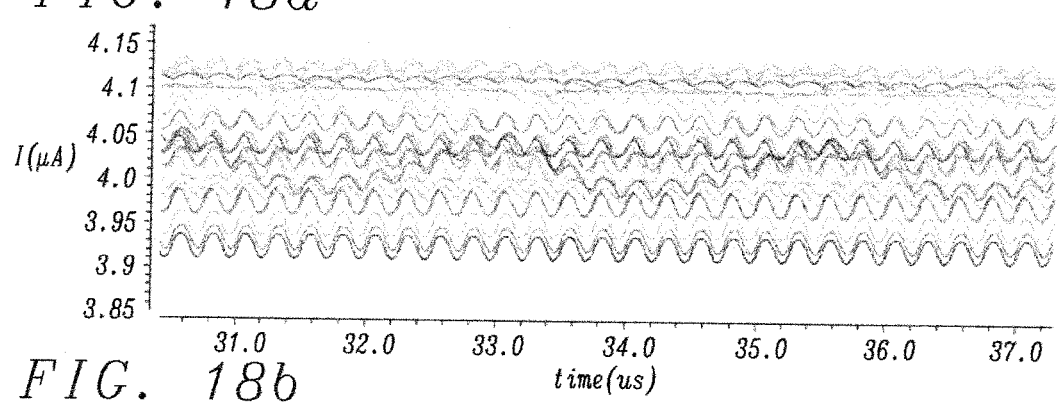
FIG. 18b is a plot of the simulated dual phase corrected load sense current of the average current extractor of FIG. 9 as incorporated in a buck SMPC embodying the principals of this disclosure.

FIG. 18*a* is a plot of the simulated dual phase coil current of the average current extractor of FIG. 9 as incorporated in an SMPC. FIG. 18*b* is a plot of the simulated dual phase corrected load sense current of the average current extractor of FIG. 9 as incorporated in an. FIG. 18*a* is a transient simulation from the dual phase SMPC showing the coil current IL. FIG. 18*b* is a transient simulation from the dual phase SMPC showing the corrected correction current $I_{COR}$. The transient simulations for FIGS. 16*a* and 16*b* are repeated for various SMPC input voltage $V_I$ and SMPC output voltage $V_o$ values. It will be noted that the spread of the corrected correction current $I_{COR}$ is very little.

Figure 19:
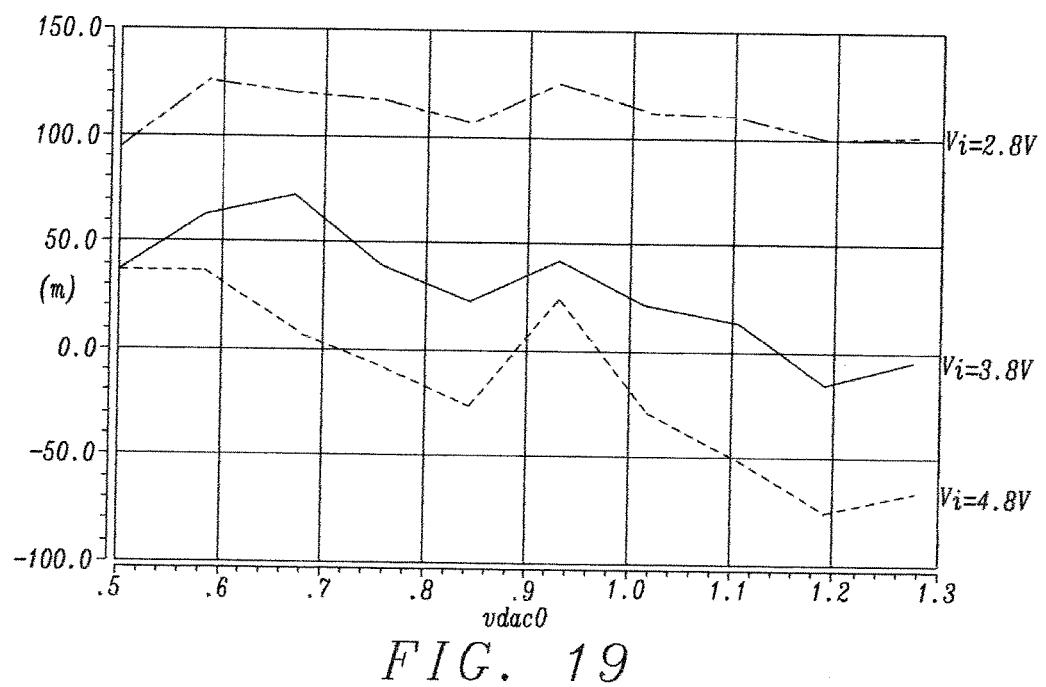
FIG. 19 is a plot of the simulated dual phase peak to average error after correction of the average current extractor of FIG. 9 as incorporated in a buck SMPC embodying the principals of this disclosure.

FIG. 19 is a plot of the simulated dual phase peak to average error after correction of the average current extractor of FIG. 9 as incorporated in an SMPC as extracted from transient simulation of FIGS. 18*a* and 18*b*. FIG. 18 shows the dual phase SMPC output voltage $V_o$ on the x-axis and input voltage $V_i$ is plotted as the separate plots of $V_i$=2.8V, $V_i$=3.8V and $V_i$=4.8V showing the improvement in the average error current $I_{error}$.

Figure 20:
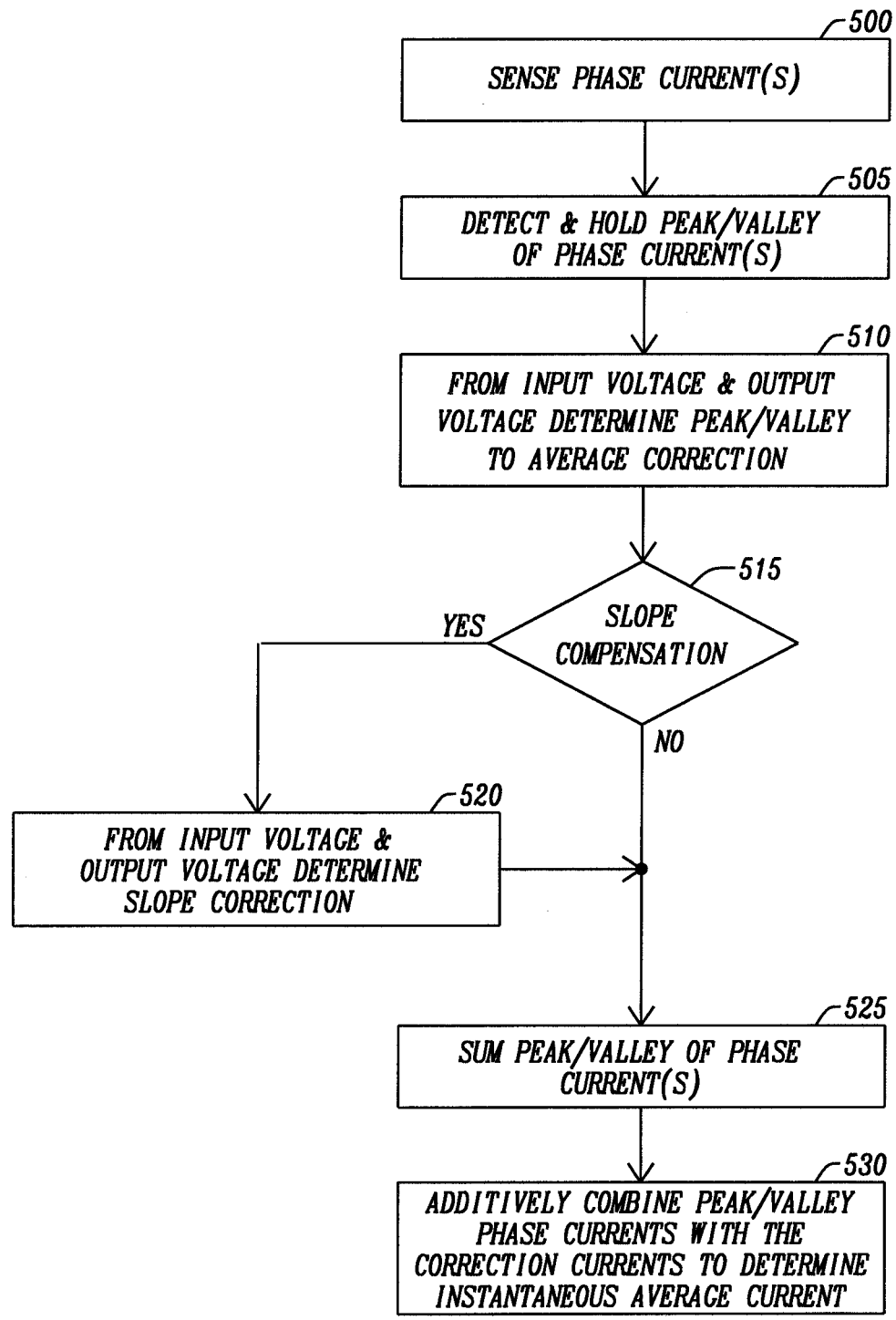
FIG. 20 is a flow chart of a method for calculating average load current of an SMPC embodying the principals of this disclosure.

FIG. 20 is a flow chart of a method for calculating average load current of an SMPC embodying the principals of this disclosure. The method begins with sensing (Box 500) the phase currents of the single phase or multiple phases of the an SMPC. The peak or valley current of the single phase or multiple phases of the SMPC are detected and held (Box 505). The ripple current $\Delta I_L$ for the SMPC without slope compensation determined (Box 510) from the input voltage $V_i$ and the output voltage $V_o$ according to Equation (2). If an SMPC has slope compensation correction as determined by (Box 515), the slope compensation is determined (Box 520) by Equation (5). If the SMPC has no slope compensation as determined by (Box 515) or the slope compensation correction is determined by (Box 520), the peak currents or valley currents are summed (Box 525) to determine the total current peak current or valley current of the SMPC. The total of the SMPC peak current or valley current is additively combined (Box 530) with the correction currents of Equation (2) or Equation (5) to determine the instantaneous average current $I_{AVG}$. The instantaneous average current $I_{AVG}$ is used either within the SMPC as a control signal of the SMPC or transferred to external circuitry for use with an electronic system connected to and powered by the SMPC.

While this disclosure has been particularly shown, and described with reference to the preferred embodiments thereof, it will be understood by those skilled in the art that various changes in form and details may be made without departing from the spirit and scope of the disclosure.

What is claimed is:

1. An average load current calculator circuit configured for determining an average load current within a switch mode power converter (SMPC) that includes at least one phase, comprising:
   at least one peak/valley detector in communication with the at least one phase of the SMPC and configured for receiving a current sense signal from the at least one phase of the SMPC indicating the magnitude of the current flowing through an inductor of the at least one phase of the SMPC and configured for determining and holding a peak or valley amplitude of the current sense signal;
   a current corrector circuit connected for receiving an input voltage and an output voltage of the at least one phase SMPC and configured to receive an inductance value of the inductor of the at least one phase of the SMPC and configured for determining an average correction current of the peak or valley amplitude of the current sense signal from the input voltage, the output voltage and the inductance value; and
   an average current generator in communication with the at least one peak/valley detector for receiving the peak or valley amplitude of the current sense signal and in communication with the current corrector circuit for receiving the average correction current, and configured for determining the average load current within a switch mode power converter (SMPC) by additively combining the peak or valley amplitude of the current sense signal and the average correction current.

2. The average load current calculator circuit of claim 1 wherein when the SMPC comprises two or more phases, the average current generator comprises a summation circuit configured for summing the peak or valley amplitude of the current sense signal for each of the two or more phase of the SMPC and the average current generator is configured for receiving a number of phases indicator signal and configured for multiplying the number of phases indicator signal by the average correction current to determine a total average correction current for the two or more phase of the SMPC.

3. The average load current calculator circuit of claim 1 wherein the average correction is one half of a ripple current of the current flowing through an inductor of the at least one phase of the SMPC and the ripple is determined by the equation $$\Delta_{IL} = V_o(1 - V_o/V_i)/L*T$$

Where:
$\Delta_{IL}$ is the indication of the ripple current;
$V_o$ is the output voltage of the SMPC;
$V_i$ is the input voltage of the SMPC;
T is the switching period of the SMPC;
L is the inductance of the inductor of the at least one phase of the SMPC.

4. The average load current calculator circuit of claim 1 wherein the SMPC comprises a slope compensation circuit configured for generating a compensation current from a control circuit of the SMPC, wherein the current corrector circuit is configured for determining the average correction current by the equation:

$$I_{COR} = \frac{V_o\left(1 - \frac{V_o}{V_i}\right)}{2L} * T + I_{COMP} * \frac{V_0}{V_i} T$$

Where:
$I_{COR}$ is the indication of the average correction current;
$V_o$ is the output voltage of the SMPC;
$V_i$ is the input voltage of the SMPC;
T is the switching period of the SMPC;
L is the inductance of the inductor of the SMPC; and
Icomp is the amplitude indication of a compensation current.

5. The average load current calculator circuit of claim 1 wherein the current corrector circuit is a linear current corrector circuit configured for determining the average current correction by the equation:

$$I_{COR} = I_{orig} - I_{ped} - G_{fit}*(V_o - V_{min})$$

Where:
$I_{COR}$ is the linear correction current;
$I_{orig}$ is the peak current measurement;
$I_{ped}$ is the current offset at a minimum output voltage;
$G_{fit}$ is an empirically determined constant chosen for best fit;
$V_o$ is the selected output voltage of the SMPC;
$V_{min}$ is the lowest allowed output voltage of the SMPC.

6. The average load current calculator circuit of claim 5 wherein when the current corrector circuit is a linear current corrector circuit, the current corrector circuit comprises a scaled difference calculator configured for calculating the term $G_{fit}*(V_o - V_{min})$ upon receiving the output voltage of the SMPC.

7. The average load current calculator circuit of claim 6 wherein the current corrector circuit further comprises a scaling circuit configured for receiving an indication of the number of phases of the at least one phase SMPC, the compensation current, and an indication of the value of the inductance of the inductor of each phase of the multiple phases of the SMPC and is further configured determining the average correction current by additively combining the current offset at a minimum output voltage and the output signal from scaled difference calculator from the peak or valley amplitude of the current sense signal.

8. The average load current calculator circuit of claim 1 wherein the current corrector circuit is a quadratic current corrector circuit configured for determining the correction current by the equation:

$$I_{COR} = \frac{V_o}{2L}T + (n - 0.5) * \frac{V_o}{L} * \frac{V_0}{V_i}T$$

Where:
$I_{COR}$ is the indication of the average correction current;
$V_o$ is the output voltage of the SMPC;
$V_i$ is the input voltage of the SMPC;
T is the switching period of the SMPC;
L is the inductance of the inductor of the SMPC; and
n is a constant of proportionality for the slope compensation current value.

9. The average load current calculator circuit of claim 8 wherein the current corrector has a scaled difference calculator configured for calculating the term $$(n - 0.5) * \frac{V_o}{L} * \frac{V_0}{V_i}T$$

from the above equation, wherein the output voltage and the input voltage of the SMPC are applied to the scaled difference calculator with the constant of proportionality being preprogrammed to the scaled difference calculator.

10. The average load current calculator circuit of claim 1 wherein the current corrector circuit comprises a scaling circuit configured for receiving an indication of the number of the multiple phases of the SMPC, the compensation current, and an indication of the value of the inductance of the inductor of each phase of the multiple phases of the SMPC and further configured for determining the correction current by adding the slope compensation current value with a slope compensation peak current value.

11. The average load current calculator circuit of claim 1 wherein the current error corrector circuit has a dynamic slope compensator that is configured for reduction in sub-harmonic oscillations dependent upon the output voltage which in turn is dependent on a downward slope of the inductor current and is configured for receiving the output voltage and determining the amount of the slope compensation current by the equation:

$$Icomp = n * \frac{V_0}{L} T$$

Where:
Icomp is the amplitude indication of a compensation current;
$V_o$ is the output voltage of the SMPC;
n is a constant of proportionality for the slope compensation peak current value;
T is the switching period of the SMPC; and
L is the inductance of the inductor of the SMPC.

12. The average load current calculator circuit of claim 1 wherein the at least one peak/valley detector is configured for receiving a sensed replication of the inductor current of the at least one phase of the SMPC associated and the peak/valley detector comprises:
   a current to voltage converter configured for converting the sensed-replica of the inductor current to an inductor current amplitude voltage;
   a sampling and hold circuit configured for sampling and holding the inductor current amplitude voltage,
   a voltage to current converter configured for converting the sampled and held inductor current amplitude voltage to a peak or valley current representing the peak or valley amplitude of the current sense signal.

13. The average load current calculator circuit of claim 12 wherein the average current generator combines the peak or valley current of at least one phase of the SMPC with the average correction current for determining the average load current.

14. A switch mode power converter (SMPC) control circuit comprising;
   an average load current calculator configured for determining an average load current within a switch mode power converter (SMPC) that includes at least one phase, comprising:
      at least one peak/valley detector in communication with the at least one phase of the SMPC and configured for receiving a current sense signal from the at least one phase of the SMPC indicating the magnitude of the current flowing through an inductor of the at least one phase of the SMPC and configured for determining and holding a peak or valley amplitude of the current sense signal;
      a current corrector circuit connected for receiving an input voltage and an output voltage of the at least one phase SMPC and configured to receive an inductance value of the inductor of the at least one phase of the SMPC and configured for determining an average correction current of the peak or valley amplitude of the current sense signal from the input voltage, the output voltage and the inductance value; and
      an average current generator in communication with the at least one peak/valley detector for receiving the peak or valley amplitude of the current sense signal and in communication with the current corrector circuit for receiving the average correction current, and configured for determining the average load current within a switch mode power converter (SMPC) by additively combining the peak or valley amplitude of the current sense signal and the average correction current.

15. The switch mode power converter (SMPC) control circuit of claim 14 wherein when the SMPC comprises two or more phases, the average current generator comprises a summation circuit configured for summing the peak or valley amplitude of the current sense signal for each of the two or more phase of the SMPC and the average current generator is configured for receiving a number of phases indicator signal and configured for multiplying the number of phases indicator signal by the average correction current to determine a total average correction current for the two or more phase of the SMPC.

16. The switch mode power converter (SMPC) control circuit of claim 14 wherein the average correction current is one half of a ripple current of the current flowing through an inductor of the at least one phase of the SMPC and the ripple current is determined by the equation:

$$\Delta_{IL} = V_o(1-V_o/V_i)/L*T$$

Where:
$\Delta_{IL}$ is the indication of the ripple current;
$V_o$ is the output voltage of the SMPC;
$V_i$ is the input voltage of the SMPC;
T is the switching period of the SMPC;
L is the inductance of the inductor of the at least one phase of the SMPC.

17. The switch mode power converter (SMPC) control circuit of claim 14 wherein the SMPC comprises a slope compensation circuit configured for generating a compensation current from a control circuit of the SMPC, wherein the current corrector circuit is configured for determining the average correction current by the equation:

$$I_{COR} = \frac{V_o\left(1-\frac{V_o}{V_i}\right)}{2L} * T + I_{COMP} * \frac{V_0}{V_i} T$$

Where:
$I_{COR}$ is the indication of the average correction current;
$V_o$ is the output voltage of the SMPC;
$V_i$ is the input voltage of the SMPC;
T is the switching period of the SMPC;
L is the inductance of the inductor of the SMPC; and
Icomp is the amplitude indication of a compensation current.

18. The switch mode power converter (SMPC) control circuit of claim 14 wherein the current corrector circuit is a linear current corrector circuit configured for determining the average current correction by the equation:

$$I_{COR} = I_{orig} - I_{ped} - G_{fit} * (V_o - V_{min})$$

Where:
$I_{COR}$ is the linear correction current;
$I_{orig}$ is the peak current measurement;
$I_{ped}$ is the current offset at a minimum output voltage;
$G_{fit}$ is an empirically determined constant chosen for best fit; $V_o$ is the selected output voltage of the SMPC;
$V_{min}$ is the lowest allowed output voltage of the SMPC.

19. The switch mode power converter (SMPC) control circuit of claim 18 wherein when the current corrector circuit is a linear current corrector circuit, the current corrector circuit comprises a scaled difference calculator configured for calculating the term $G_{fit}*(V_o-V_{min})$ upon receiving the output voltage of the SMPC.

20. The switch mode power converter (SMPC) control circuit of claim 19 wherein the current corrector circuit further comprises a scaling circuit configured for receiving an indication of the number of phases of the at least one phase SMPC, the compensation current, and an indication of the value of the inductance of the inductor of each phase of the multiple phases of the SMPC and is further configured determining the average correction current by additively combining the current offset at a minimum output voltage and the output signal from scaled difference calculator from the peak or valley amplitude of the current sense signal.

21. The switch mode power converter (SMPC) control circuit of claim 14 wherein the current corrector circuit is a quadratic current corrector circuit configured for determining the correction current by the equation:

$$I_{COR} = \frac{V_o}{2L}T + (n - 0.5) * \frac{V_o}{L} * \frac{V_0}{V_i}T$$

Where:
$I_{COR}$ is the indication of the average correction current;
$V_o$ is the output voltage of the SMPC;
$V_i$ is the input voltage of the SMPC;
T is the switching period of the SMPC;
L is the inductance of the inductor of the SMPC; and
n is a constant of proportionality for the slope compensation current value.

22. The switch mode power converter (SMPC) control circuit of claim 21 wherein the current corrector has a scaled difference calculator configured for calculating the term $$(n - 0.5) * \frac{V_o}{L} * \frac{V_0}{V_i}T$$

wherein the output voltage and the input voltage of the SMPC are applied to the scaled difference calculator with the constant of proportionality being preprogrammed to the scaled difference calculator.

23. The switch mode power converter (SMPC) control circuit of claim 14 wherein the current corrector circuit comprises a scaling circuit configured for receiving an indication of the number of the multiple phases of the SMPC, the compensation current, and an indication of the value of the inductance of the inductor of each phase of the multiple phases of the SMPC and further configured for determining the correction current by adding the slope compensation current value with a slope compensation peak current value.

24. The switch mode power converter (SMPC) control circuit of claim 14 wherein the current error corrector circuit has a dynamic slope compensator that is configured for reduction in sub-harmonic oscillations dependent upon the output voltage which in turn is dependent on a downward slope of the inductor current and is configured for receiving the output voltage and determining the amount of the slope compensation current by the equation:

$$Icomp = n * \frac{V_0}{L}T$$

Where:
Icomp is the amplitude indication of a compensation current;
$V_o$ is the output voltage of the SMPC;
n is a constant of proportionality for the slope compensation peak current value;
T is the switching period of the SMPC; and
L is the inductance of the inductor of the SMPC.

25. The switch mode power converter (SMPC) control circuit of claim 14 wherein the at least one peak/valley detector is configured for receiving a sensed replication of the inductor current of the at least one phase of the SMPC associated and the peak/valley detector comprises:
a current to voltage converter configured for converting the sensed-replica of the inductor current to an inductor current amplitude voltage;
a sampling and hold circuit configured for sampling and holding the inductor current amplitude voltage,
a voltage to current converter configured for converting the sampled and held inductor current amplitude voltage to a peak or valley current representing the peak or valley amplitude of the current sense signal.

26. The switch mode power converter (SMPC) control circuit of claim 25 wherein the average current generator combines the peak or valley current of at least one phase of the SMPC with the average correction current for determining the average load current.

27. A method for determining an instantaneous average load current of an SMPC having at least one phase comprises the steps of:
sensing the at least one inductor current from the at least one phase of the SMPC;
detecting a peak or valley current of the at least one inductor current;
holding the peak or valley current of the at least one inductor current;
summing the peak or valley currents, when there at least two phases of the SMPC;
determining an average correction current from an input voltage and an output voltage of the SMPC;
determining the instantaneous average load current of an SMPC by additively combining the peak or valley current of the at least one inductor current with the average correction current.

28. The method for determining the instantaneous average load current of claim 27 wherein in determining an average correction current is ascertained as one half of a ripple current of the current flowing through an inductor of the at least one phase of the SMPC and the ripple current is determined by the equation:

$$\Delta_{IL}=V_o(1-V_o/V_i)/L*T$$

Where:
$\Delta_{IL}$ is the indication of the ripple current;
$V_o$ is the output voltage of the SMPC;
$V_i$ is the input voltage of the SMPC;
T is the switching period of the SMPC;
L is the inductance of the inductor of the at least one phase of the SMPC.

29. The method for determining the instantaneous average load current of claim 27 wherein the SMPC comprises a slope compensation circuit configured for generating a compensation current from a control circuit of the SMPC, wherein the step of determining the average correction current is determined by the equation:

$$I_{COR}=\frac{V_o\left(1-\frac{V_o}{V_i}\right)}{2L}*T+I_{COMP}*\frac{V_0}{V_i}T$$

Where:
$I_{COR}$ is the indication of the average correction current;
$V_o$ is the output voltage of the SMPC;
$V_i$ is the input voltage of the SMPC;
$T_{is}$ the switching period of the SMPC;
L is the inductance of the inductor of the SMPC; and
Icomp is the amplitude indication of a compensation current.

30. The method for determining the instantaneous average load current of claim 27 wherein in determining an average correction current is linearly ascertained the equation:

$$I_{COR}=I_{orig}-I_{ped}-G_{fit}*(V_o-V_{min})$$

Where:
$I_{COR}$ is the linear correction current;
$I_{orig}$ is the peak current measurement;
$I_{ped}$ is the current offset at a minimum output voltage;
$G_{fit}$ is an empirically determined constant chosen for best fit;
$V_o$ is the selected output voltage of the SMPC;
$V_{min}$ is the lowest allowed output voltage of the SMPC.

31. The method for determining the instantaneous average load current of claim 27 wherein in determining an average correction current is quadraticly ascertained by the equation:

$$I_{COR}=\frac{V_o}{2L}T+(n-0.5)*\frac{V_o}{L}*\frac{V_0}{V_i}T$$

Where:
$I_{COR}$ is the indication of the average correction current;
$V_o$ is the output voltage of the SMPC;
$V_i$ is the input voltage of the SMPC;
T is the switching period of the SMPC;
L is the inductance of the inductor of the SMPC; and
n is a constant of proportionality for the slope compensation current value.

32. The method for determining the instantaneous average load current of claim 27 wherein in the step of determining an average correction current comprises the step of establishing dynamic slope compensation for reducing sub-harmonic oscillations dependent upon the output voltage which in turn is dependent on a downward slope of the inductor current by ascertaining the amount of the slope compensation current by the equation:

$$Icomp=n*\frac{V_0}{L}T$$

Where:
Icomp is the amplitude indication of a compensation current;
$V_o$ is the output voltage of the SMPC;
n is a constant of proportionality for the slope compensation peak current value;
T is the switching period of the SMPC; and
L is the inductance of the inductor of the SMPC.

* * * * *